US007756172B2

(12) United States Patent  (10) Patent No.: US 7,756,172 B2
Giesen et al.  (45) Date of Patent: Jul. 13, 2010

(54) OPTICALLY PUMPED SEMI-CONDUCTIVE LASER

(75) Inventors: Adolf Giesen, Aichtal (DE);
Svent-Simon Beyertt, Esslingen (DE);
Uwe Brauch, Stuttgart (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 394 days.

(21) Appl. No.: 10/999,894

(22) Filed: Nov. 29, 2004

(65) Prior Publication Data

US 2005/0152415 A1    Jul. 14, 2005

Related U.S. Application Data

(63) Continuation of application No. PCT/EP03/05270, filed on May 20, 2003.

(30) Foreign Application Priority Data

May 29, 2002   (DE)   ................................ 102 23 879

(51) Int. Cl.
*H01S 3/04*   (2006.01)
(52) U.S. Cl. .................... 372/34; 372/35; 372/43.01; 372/50.1; 372/50.22
(58) Field of Classification Search .................. 372/34, 372/35, 50.1, 50.22, 43.01, 70, 71
See application file for complete search history.

(56) References Cited

U.S. PATENT DOCUMENTS 5,131,002 A   7/1992   Mooradian
5,313,324 A   5/1994   Le et al.

(Continued)

FOREIGN PATENT DOCUMENTS

DE   19835107   2/2000

(Continued)

OTHER PUBLICATIONS

Jeong, et al., "Analysis and assessment of the gain of optically pumped surface-normal optical amplifiers," *Optics Communications*, Feb. 15, 1997, pp. 227-232.

(Continued)

*Primary Examiner*—Minsun Harvey
*Assistant Examiner*—Delma R Forde
(74) *Attorney, Agent, or Firm*—Cohen Pontani Lieberman & Pavane LLP

(57) ABSTRACT

In order to operate a laser amplifier system comprising a solid-state body thermally coupled to a cooling member and having a laser active volume area, in which at least one laser-active amplifier structure consisting of semiconductor material is arranged in at least one surface and extends at least over partial areas of the surface, a pumping radiation source generating a pumping radiation field for the optical pumping of the laser-active volume area and an optical means of the amplifier defining a laser amplifier radiation field passing through the laser active volume area, as efficiently as possible it is suggested that the absorption of pumping radiation from the pumping radiation field in the laser-active amplifier structure be equal to or greater than the absorption of pumping radiation by a surrounding structure adjacent to the amplifier structure and that the pumping radiation field proceed such that it passes several times through the amplifier structure.

55 Claims, 12 Drawing Sheets

U.S. PATENT DOCUMENTS

| | | | |
|---|---|---|---|
| 5,553,088 A * | 9/1996 | Brauch et al. | 372/34 |
| 6,188,708 B1 | 2/2001 | Schmitt et al. | |
| 6,327,293 B1 * | 12/2001 | Salokatve et al. | 372/96 |
| 6,347,109 B1 * | 2/2002 | Beach et al. | 372/75 |
| 6,438,152 B2 | 8/2002 | Contag et al. | |
| 6,577,666 B2 | 6/2003 | Erhard et al. | |
| 6,611,546 B1 * | 8/2003 | Garnache et al. | 372/92 |
| 6,735,234 B1 * | 5/2004 | Paschotta et al. | 372/75 |
| 6,741,629 B1 * | 5/2004 | Garnache et al. | 372/96 |
| 6,822,988 B1 * | 11/2004 | Okazaki et al. | 372/38.06 |
| 6,839,368 B2 * | 1/2005 | Thakur | 372/39 |
| 6,847,673 B2 * | 1/2005 | Dane et al. | 372/75 |
| 6,859,481 B2 * | 2/2005 | Zheng | 372/70 |
| 6,891,874 B2 | 5/2005 | Erhard et al. | |
| 6,891,877 B2 * | 5/2005 | Krause et al. | 372/70 |
| 7,058,245 B2 * | 6/2006 | Farahi | 385/14 |
| 7,209,506 B2 * | 4/2007 | Albrecht | 372/50.124 |
| 7,379,488 B2 * | 5/2008 | Kim | 372/99 |
| 2001/0043636 A1 * | 11/2001 | Bewley et al. | 372/70 |
| 2004/0013154 A1 * | 1/2004 | Zheng | 372/96 |
| 2004/0190582 A1 * | 9/2004 | Brick et al. | 372/97 |
| 2004/0233961 A1 * | 11/2004 | Lutgen | 372/70 |
| 2005/0083980 A1 * | 4/2005 | Brick | 372/43 |
| 2005/0281308 A1 * | 12/2005 | Kim | 372/70 |
| 2007/0160102 A1 * | 7/2007 | Brick et al. | 372/50.124 |

FOREIGN PATENT DOCUMENTS

| | | | |
|---|---|---|---|
| DE | 19835108 | | 2/2000 |
| DE | 10005195 | | 8/2001 |
| EP | 0 632 551 | | 1/1995 |
| JP | 06505369 | | 6/1994 |
| JP | 2004-207724 | * | 7/2004 |

OTHER PUBLICATIONS

W. Bladau, "Halbleiter-Optoelektronik," 1995, Hanser Verlag München Wien, Gersthofen XP-002271555, pp. 182-185.

Brauch U. et al.: "High-Power Diode Lasers for Direct Applications", R. Hiehl (ed.), High-Power Diode Lasers, Topics Appl., Physics 78, Springer-Verlag, Berlin Heidelberg, 2000, pp. 303-367.

Bohn M. J. et al.: "Resonant Optical Pumping of Vertical-cavity Surface Emitting Lasers", Optics Communications, vol. 117, No. 1, 1995, pp. 111-115.

Grundmann M.: "Quantum Devices of Reduced Dimensionality", Universitaet Leipzig, Leipzig,Germany, 2005, Elsevier Ltd., pp. 17-22.

English translation of an Examination Report dated Sep. 14, 2009 issued in the corresponding Japanese application.

Ebeling, Karl J.,"Integrated Optoelectronics—Waveguide Optics Photonics Semiconductors", Springer-Verlag, 1993, pp. 218-224.

* cited by examiner

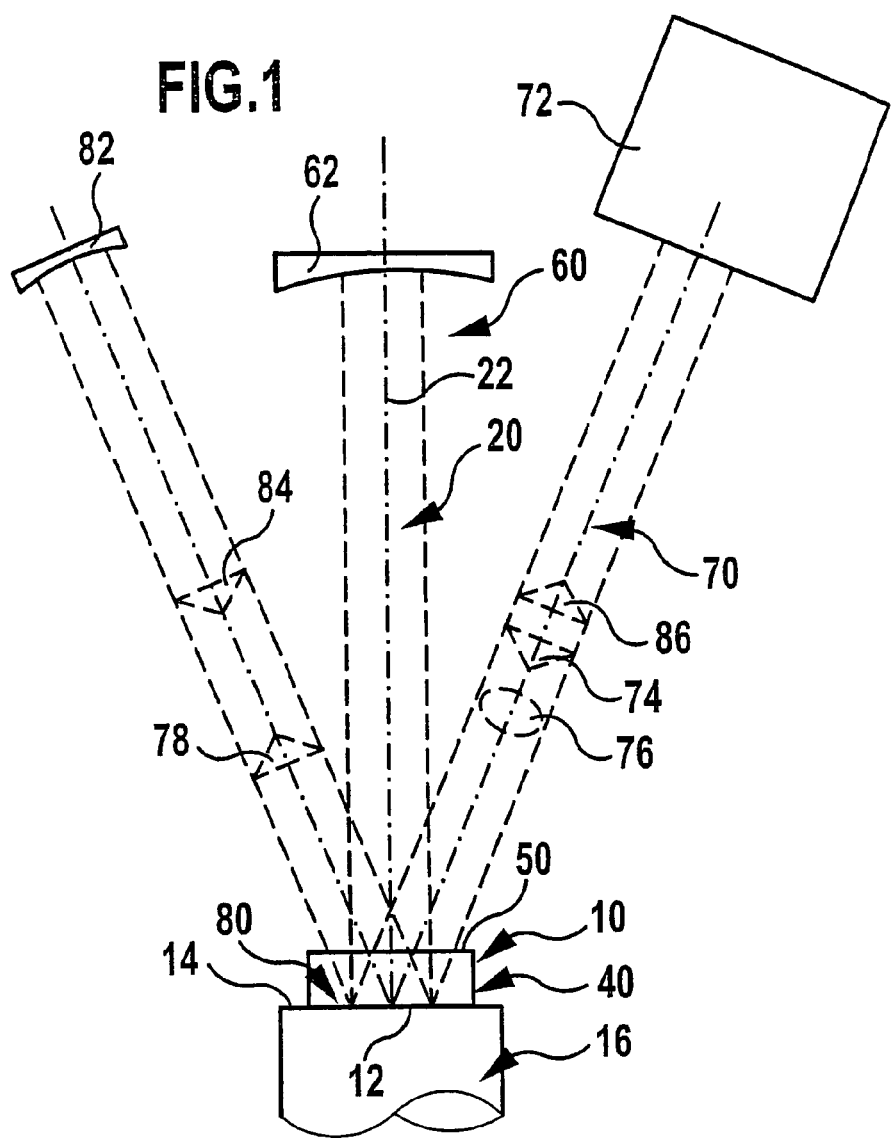
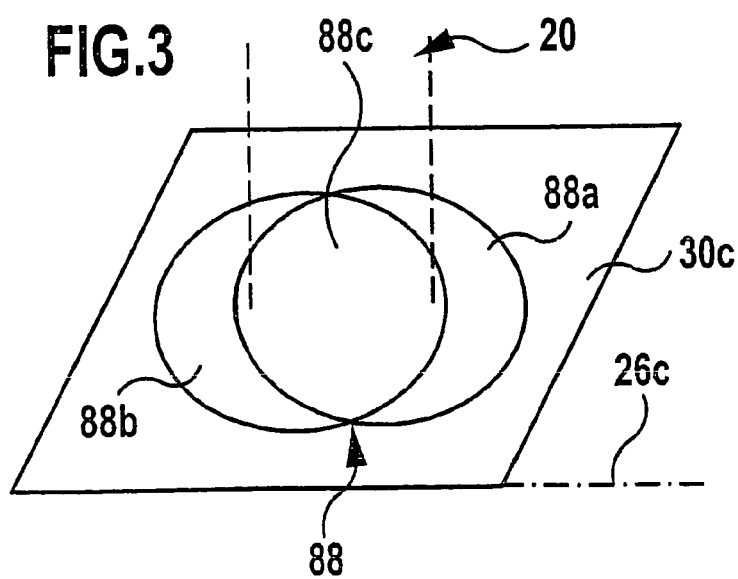

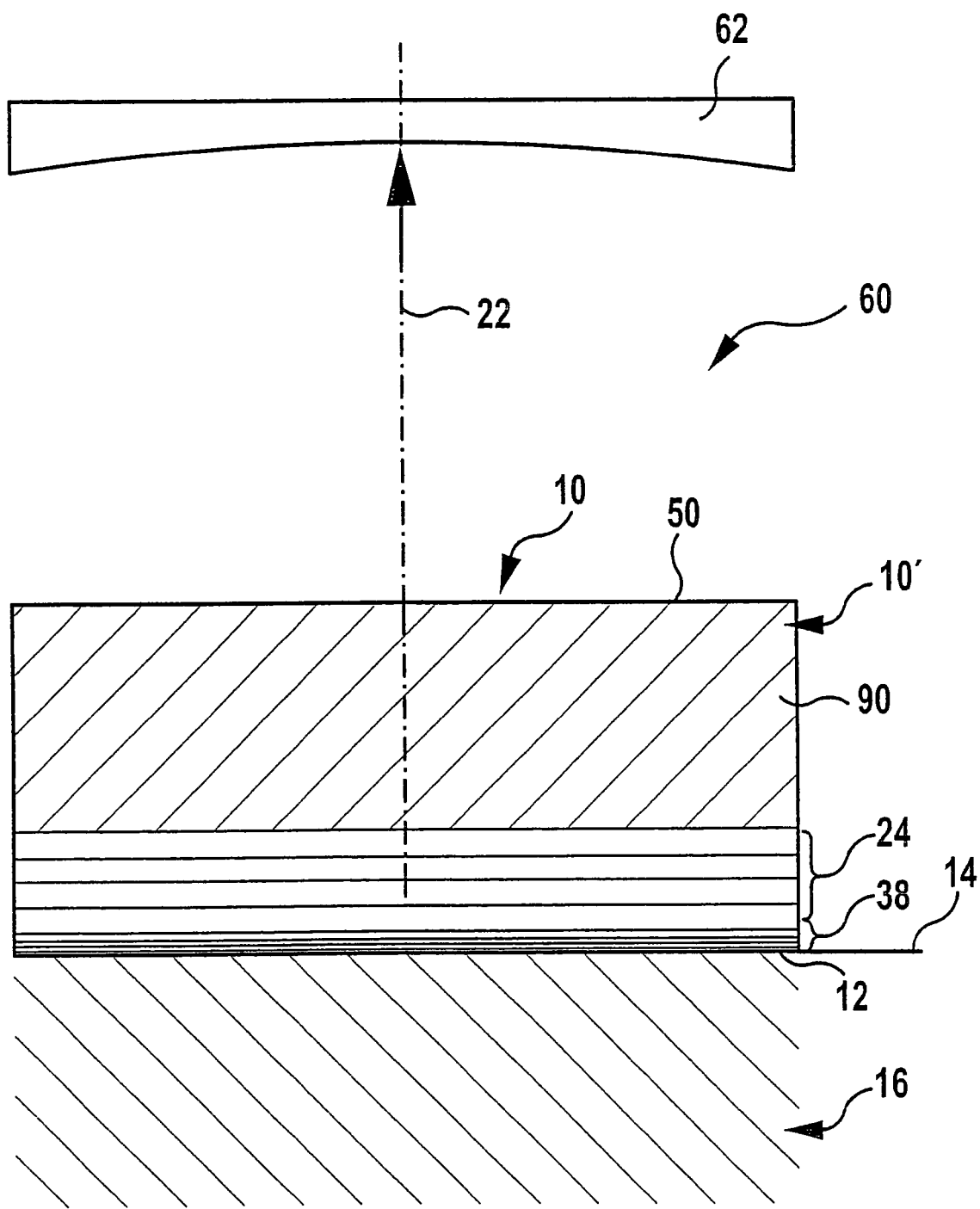

OPTICALLY PUMPED SEMI-CONDUCTIVE LASER

This application is a continuation of international application number PCT/EP03/05270 filed on May 20, 2003.

The present disclosure relates to the subject matter disclosed in International application No. PCT/EP03/05270 of May 20, 2003, which is incorporated herein by reference in its entirety and for all purposes.

BACKGROUND OF THE INVENTION

The invention relates to a laser amplifier system comprising a solid-state body thermally coupled to a cooling body and having a laser-active volume area, in which at least one laser-active amplifier structure consisting of semiconductor material is arranged in at least one surface and extends at least over partial areas of the surface, a pumping radiation source generating a pumping radiation field for the optical pumping of the laser-active volume area and an optical means of the amplifier defining a laser amplifier radiation field passing through the laser-active volume area.

Laser amplifier systems of this type are known from the state of the art.

Proceeding from laser amplifier systems of this type, the object underlying the invention is to operate the laser amplifier systems as efficiently as possible.

SUMMARY OF THE INVENTION

This object is accomplished in accordance with the invention, in a laser amplifier system of the type described at the outset, in that the absorption of pumping radiation from the pumping radiation field in the laser-active amplifier structure is equal to or greater than the absorption of pumping radiation by a surrounding structure adjacent to the amplifier structure and that the pumping radiation field proceeds such that it passes through the amplifier structure several times.

The advantage of the inventive solution is to be seen in the fact that with it the pumping radiation is predominantly absorbed in the amplifier structure itself and, therefore, losses during the migration of holes and electrons into the amplifier structure can be reduced.

Furthermore, an efficient pumping of the amplifier structure is achieved in that the pumping radiation field passes through the amplifier structure several times.

In this respect, it is particularly advantageous when the absorption of pumping radiation in the at least one amplifier structure outweighs the absorption of pumping radiation in the surrounding structure adjacent to the amplifier structure.

It is even better when the absorption of pumping radiation in the surrounding structure is negligible in comparison with the absorption of pumping radiation in the amplifier structure and so the amplifier structure is essentially pumped directly by the pumping radiation.

Particularly in order to avoid any unnecessary heating of the solid-state body, it is particularly advantageous when the absorption of pumping radiation in the at least one amplifier structure outweighs the absorption of pumping radiation in the remaining volume areas of the solid-state body outside the amplifier structure.

With respect to the design of the laser-active volume area, no further details have been given in conjunction with the preceding explanations concerning the inventive solution. In principle, it is, first of all, sufficient to provide one amplifier structure which extends in a surface associated with it.

The amplification of the laser amplifier radiation field may, however, be improved further in that the laser-active volume area has several amplifier structures which are located at a distance from one another but in surfaces arranged one above the other in a stacking direction. As a result, each of the amplifier structures can contribute to the amplification of the laser amplifier radiation field when this passes through the respective amplifier structure.

With respect to the design of the surrounding structures, no further details have been given so far. In principle, the surrounding structures, since they are not decisive for the immediate functioning of the amplifier structure, could consist of any optional materials as long as no interference of the amplifier structure takes place.

However, surrounding structures behave in a particularly interference-free manner when they are formed from a semiconductor material, wherein the surrounding structure preferably has a crystal structure and similar lattice constants, if not essentially the same lattice constants as the amplifier structure itself.

A particularly favorable solution provides for the surrounding structure to be formed by layers consisting of semiconductor material since the surrounding structures may, as a result, be built up in a simple manner adjacent to the quantum structure.

In order to ensure that the electrons and holes generated by the optical pumping remain in the amplifier structure, it is preferably provided for the semiconductor material of the amplifier structure to have a smaller band distance than the surrounding structure.

The band distance is to be understood as the customary term in semiconductor technology, namely the difference in energy between the uppermost valence band and the lowermost conduction band.

A preferred embedding of the amplifier structure in the solid-state body provides for at least one respective surrounding structure to be arranged on either side of the surface, in which the amplifier structure is arranged.

With respect to the design of the surrounding structure itself, no further details have so far been given. One advantageous solution, for example, provides for each surrounding structure to have transversely to the surface a thickness which amounts to a multiple of the thickness of the amplifier structure so that an optimum embedding and screening of the amplifier structure in relation to influences of other areas of the solid-state body can be achieved.

In this respect, it is provided, for example, for the surrounding structure to have transversely to the surface a thickness which amounts to at least 10 nm.

It is even better when the surrounding structure has transversely to the surface a thickness which amounts to at least 30 nm.

With respect to the arrangement of the amplifier structures in the laser-active volume area, no further details have been given in conjunction with the preceding explanations concerning the inventive solution. One particularly favorable solution, for example, provides for the amplifier structures to be separated from one another by intermediate layers lying between them.

The intermediate layers may consist of any optional materials.

Intermediate layers of this type will preferably comprise respective surrounding structures arranged adjacent to the amplifier structure. The intermediate layers may, in this respect, be built up exclusively from surrounding structures. It is, however, also possible to provide intermediate layers consisting of additional materials or materials of a different type between the surrounding structures.

The intermediate layers preferably consist of such a material that the absorption of pumping radiation from the pumping radiation field in the amplifier structures is equal to or greater than the absorption of pumping radiation by the intermediate layers.

The absorption of pumping radiation by the intermediate layers is preferably negligible in comparison with the absorption of pumping radiation in the amplifier structures.

With respect to the course of the laser amplifier radiation field relative to the surfaces, in which the amplifier structures are arranged, no further details have so far been given.

A particularly favorable amplification in the laser amplifier radiation field can be achieved when the laser amplifier radiation field proceeds transversely to the surface, in which the amplifier structure extends.

In this respect, the laser amplifier radiation field preferably proceeds approximately in the direction of the stacking direction of the amplifier structures.

With respect to the distance between the amplifier structures in the direction of the course of the laser amplifier radiation field, no further details have so far been given.

In the case of at least some of the amplifier structures, one particularly favorable solution provides, for example, for these to have in the direction of the course of the laser amplifier radiation field, preferably in the stacking direction, distances which correspond approximately to half the wavelength or to an integral multiple of half the wavelength of the laser amplifier radiation field in the case of optimum laser amplification.

As a result, it is possible for all the amplifier structures to be arranged at the specified distances in stacking direction or for amplifier structures to be combined to form groups with amplifier structures arranged at smaller distances within each group and for the groups of amplifier structures to be arranged at the specified distances so that the amplifier structures of different groups are then likewise arranged at the specified distances.

If such distances between the amplifier structures in the solid-state body are present without any laser amplification of the laser-active volume area resulting due to optical pumping by the pumping radiation source, there is the risk of these distances no longer corresponding exactly to the predetermined distances in the state of laser amplification of the laser-active volume area.

For this reason, it is preferably provided for the distances between the amplifier structures to correspond to the multiple of half the wavelength of the optimum laser amplification in the thermodynamic state of equilibrium of the solid-state body during laser amplification of the laser-active volume area.

With respect to the alignment of the surface, in which the amplifier structure respectively associated with it is arranged, no further details have so far been given.

One expedient solution provides for the surface, in which the amplifier structure is arranged, to extend approximately parallel to an outer cooling surface of the solid-state body.

An additional, advantageous solution provides for the surface, in which the amplifier structure is arranged, to extend approximately parallel to an exit surface for the laser amplifier radiation field.

Approximately parallel means in this respect that the surfaces can form an angle with one another of up to 10°.

In order, in the case of the inventive laser amplifier system, to prevent any radiation amplification also taking place in the case of radiation propagating in the direction of the surface or radiation propagating at an angle to the surface, it is preferably provided for an optically inactive layer with a thickness which amounts to a multiple of the wavelength of the laser amplifier radiation field to be located between the exit surface for the laser amplifier radiation field and the surface, in which the amplifier structure extends.

With respect to the design of the amplifier structure itself, no further details have so far been given.

One advantageous solution, for example, provides for the amplifier structure to have a thickness which is so slight that an increase in the density of states at the band edge of the amplifier structure occurs as a result thereof.

The amplifier structure may be thicker in a direction at right angles to the respective surface than customary quantum structures used in the case of semiconductor lasers. A favorable solution does, however, provide for the amplifier structure to be designed as a quantum structure.

In this respect, the thickness of the quantum structure is, in particular, approximately in the order of magnitude of the wavelength of the electrons in the material of the quantum structure.

The quantum structures are expediently dimensioned such that their thickness transversely to the surface is less than 20 nm.

With respect to the design of the quantum structure itself, the most varied of possibilities are conceivable.

One possibility, for example, provides for the quantum structure to be designed as a quantum film, wherein such a quantum film comprises approximately a two-dimensional electron gas.

An additional possibility for realizing the quantum structure is for this to be formed from quantum wires, wherein such a quantum wire comprises approximately a one-dimensional electron gas.

Another possibility is for the quantum structure to be formed from quantum points and, therefore, to comprise approximately a zero-dimensional electron gas.

With respect to the course of the laser amplifier radiation field in the solid-state body, no further details have so far been given. For example, it would be conceivable for the laser amplifier radiation field to pass through the solid-state body completely.

However, in order to be able to cool the solid-state body on one side in an optimum manner, namely preferably such that a temperature gradient, which is essentially uniform at least over the extension of the laser amplifier radiation field in the direction of the surfaces, occurs within the solid-state body in the direction of the cooling surface, it is provided for the solid-state body to have a reflector for the laser amplifier radiation field on one side of the laser-active volume area.

In this respect, the reflector could, for example, be applied to an outer surface of the solid-state body as a dielectric layer.

However, the solid-state body may be cooled particularly advantageously when the reflector is an internal reflector of a solid-state body having, in particular, monocrystalline layers since, as a result, the disadvantageous insulation effect of a dielectric, in particular, polycrystalline or amorphous layer which is applied to the solid-state body and, in particular, applied in the area of the cooling surface can be avoided.

In this respect, it is preferably provided for the internal reflector to be formed by a series of layers in the solid-state body.

A particularly favorable solution provides for the solid-state body to be provided on one side of the laser-active volume area with a reflecting volume area forming the internal reflector, wherein the layers are arranged within this reflecting volume area.

In this respect, a particularly favorable solution provides for the reflecting volume area to have an area designed as a Bragg reflector.

In accordance with the invention, the solid-state body may be cooled in an optimum manner, in particular, when the internal reflector is arranged at a distance from the cooling surface which amounts to less than 100 μm.

With respect to the course of the pumping radiation field in the solid-state body, no further details have so far been given. One advantageous embodiment, for example, provides for the pumping radiation field to pass through the laser-active volume area several times in a direction extending transversely to the surface, in which the amplifier structure extends.

A particularly favorable solution provides for the pumping radiation field to pass through the same outer surface of the solid-state body as the laser amplifier radiation field.

In this respect, this outer surface is expediently the outer surface of the solid-state body which is arranged so as to be located opposite the cooling surface.

With respect to the relative arrangement of the surface, in which the amplifier structure extends, and the surface for passage of the pumping radiation field, a particularly favorable solution provides for the surface, in which the amplifier structure is arranged, to extend parallel to a surface of the solid-state body for passage of the pumping radiation field.

With respect to the guidance of the pumping radiation field also during multiple passage thereof through the solid-state body, no further details have so far been given. For example, it would be conceivable to arrange the solid-state body such that the pumping radiation field is guided through an external optical device and the solid-state body is merely arranged such that the pumping radiation field passes through it completely several times.

It is, however, particularly favorable when the solid-state body is provided with a reflector for the pumping radiation field on one side of the laser-active volume area.

The reflector can be applied to an outer surface of the solid-state body. It is, however, even more favorable when the reflector is an internal reflector arranged in the solid-state body.

In this respect, the reflector for the pumping radiation field is preferably formed by a series of layers.

The series of layers could be arranged so as to be optionally distributed in the solid-state body.

It is, however, particularly expedient when the internal reflector for the pumping radiation field is formed by a reflecting volume area which, for its part, comprises the layers.

A favorable design provides for the reflecting volume area to comprise an area designed as a Bragg reflector.

In the case where the solid-state body comprises not only an internal reflector for the laser amplifier radiation field but also an internal reflector for the pumping radiation field, these two internal reflectors can, in principle, be designed independently of one another, wherein this presupposes that one of the reflectors should always be non-absorbing as completely as possible for the respectively other radiation field.

A particularly favorable solution therefore provides for the reflector for the laser amplifier radiation field and the reflector for the pumping radiation field to be combined to form one reflector.

In this respect, the reflector is preferably formed by a series of layers, the construction and arrangement of which are optimized with respect to the wavelength and the angle of incidence of the laser amplifier radiation field and to the wavelength and the angle of incidence of the pumping radiation field so that an optimum reflection can be achieved for both radiation fields, in particular, on account of different angles of incidence of laser amplifier radiation field and pumping radiation field.

With respect to the extension of the amplifier structure in the direction of the respectively associated surface and, therefore, transversely to the stacking direction, no further details have so far been given. In the simplest case, it is provided for the amplifier structure to extend transversely to the stacking direction and, therefore, in the direction of the associated surface as far as edge surfaces of the solid-state body.

However, in order to keep the extension of the amplifier structures small in the direction of the surface and, therefore, to suppress any amplification for radiation having the wavelength of laser amplification in the direction of the surface, it is preferably provided for the amplifier structure to have transversely to the stacking direction an extension which is smaller than that of the solid-state body in this direction.

In this respect, it is conceivable for only one amplifier structure to be provided in each surface associated with an amplifier structure.

Alternatively thereto, it is, however, also conceivable for several amplifier structures which are arranged next to one another to be provided in each surface.

In order to be able to pump the amplifier structures designed in accordance with the invention in an optimum manner, it is preferably provided for the pumping radiation field to pass through the surface, in which the respective amplifier structure extends, in a surface area which is smaller than the extension of the amplifier structure in the direction of the surface so that the pumping radiation of the pumping radiation field can be utilized in an optimum manner.

Particularly in the case of the multiple excitation, it is preferably provided for the pumping radiation field to pass through one surface area during each passage through the surface, in which the amplifier structure is arranged, and for the sum of the surface areas to result in an interconnected excitation area, in particular, for the surface areas to overlap as far as possible.

An additional solution provides for the pumping radiation field to pass at the same time through non-connected partial surface areas of the surface, in which the at least one amplifier structure is arranged, and to pump the at least one amplifier structure present within these surface areas optically.

Such a course of the pumping radiation field may preferably be achieved in that the pumping radiation field has non-connected pumping light radiation field segments, each of which passes through a partial surface area of the surface, in which the at least one amplifier structure is arranged.

An additional, improved embodiment of the inventive solution which suppresses, in particular, the amplification of radiation which has the wavelength of the laser amplifier radiation field and propagates in the direction of the surface of the amplifier structure, provides for amplifier structures arranged so as to follow one another in a direction transverse to the stacking direction to be separated optically from one another.

In this respect, the amplifier structures are preferably separated from one another by barriers consisting of optically absorbing materials, wherein the absorbing materials preferably absorb mainly in the wavelength range of a laser amplification of the quantum structures.

The suppression of undesired amplification in the direction of the surface, in which the amplifier structures are located, is particularly good when the amplifier structures are enclosed by barriers consisting of optically absorbing materials.

Barriers of this type may be realized particularly favorably when the barriers consisting of optically absorbing materials form a closed contour in the surfaces, in which the amplifier structures are located.

In order to optimize the coupling in and out of the laser amplifier radiation field, it is preferably provided for the solid-state body to be designed to be antireflecting for the laser amplifier radiation field on one side of the laser-active volume area.

This could be brought about, for example, by an antireflecting layer.

It is, however, particularly favorable, in particular, when the solid-state body is already built up of individual layers, when the solid-state body is provided with an antireflecting volume area on one side of the laser-active volume area.

Such an antireflecting volume area preferably consists of a plurality of layers which are likewise preferably produced from semiconductor material or semiconductor-like material.

In particular, the antireflecting volume area and the volume area forming the reflector are arranged on different sides of the laser-active volume area in stacking direction.

In order to also bring about an optimum coupling in of the pumping radiation field, it is preferably provided for the solid-state body to be designed to be antireflecting on an entry side of the pumping radiation field.

The antireflecting design of the solid-state body can preferably be brought about by means of an antireflecting volume area.

In one embodiment, the pumping radiation field preferably enters the solid-state body transversely to the extension of the at least one surface of the laser-active volume area. In this case, the solid-state body is designed to be antireflecting for the pumping radiation field on one side of the laser-active volume area, wherein the antireflecting construction is also intended to be antireflecting for the amplifier radiation field extending transversely to the laser-active volume area.

With this solution it is preferably provided for the antireflecting volume area and the volume area forming the reflector to be arranged on different sides of the laser-active volume area in stacking direction.

Within the scope of the preceding explanations concerning the individual embodiments, only embodiments have been mentioned, with which the pumping radiation field has entered the solid-state body through the same outer surface, through which the laser amplifier radiation field has also exited.

Alternatively or in addition thereto, it is provided in an additional, preferred embodiment for the pumping radiation field to enter the solid-state body via a side surface approximately parallel to the extension of the at least one surface of the laser-active volume area.

As a result, it is possible to pump the solid-state body transversely to the laser amplifier radiation field.

In order to be able to pump the amplifier structures optically in an optimum manner, it is provided for the pumping radiation field to enter the solid-state body divergently and to be guided in it by way of reflection in a direction transverse to the optical axis of the laser amplifier radiation field.

As a result of the divergent entry of the pumping radiation field into the solid-state body, radiation in a plurality of directions of propagation results which then, during reflections, leads, on the one hand, to the amplifier structures being pumped to a great extent with uniform intensity and thereby to the effect of the multiple passage of the pumping radiation field through the amplifier structures occurring.

The reflections of the pumping radiation field in the solid-state body can be brought about by different measures. For example, it would be conceivable to provide special reflectors in the solid-state body which are adjusted to the pumping radiation field.

When they have the laser amplifier radiation field passing through them, the reflectors are then designed to be transparent for it.

A particularly favorable solution provides, however, for the reflections of the pumping radiation field to be brought about by way of refractive index gradients in the solid-state body, i.e., for the reflections to be brought about in that the angle at the respective refractive index gradient is not below the critical angle of total reflection and, as a result, total reflection is always present.

With respect to the design and the determination of the laser amplifier radiation field, no further details have likewise been given thus far. One advantageous embodiment, for example, provides for the laser amplifier radiation field to be defined by an optical means of the amplifier which comprises at least one external mirror arranged at a distance from the solid-state body so that the optical means of the amplifier offers degrees of freedom in order to determine the laser amplifier radiation field in an optimum manner.

The inventive solution is particularly favorable when the optical means of the amplifier is designed such that it admits only a laser radiation field with the basic mode or with the basic mode and also modes close to the basic mode and so the laser amplifier radiation field has a mode structure which is advantageous for all applications, in which a good focusing is important.

Additional features and advantages of the invention are the subject matter of the following description as well as the drawings illustrating several embodiments.

BRIEF DESCRIPTION OF THE DRAWINGS

FIG. 1 shows a schematic illustration of a section through a first embodiment of an inventive laser amplifier system;

FIG. 3 shows an enlarged perspective illustration of one of the surfaces illustrated in FIG. 2, in which a quantum structure extends, with surface areas, through which the pumping radiation field passes;

FIG. 5 shows a schematic illustration similar to FIG. 1 of a second embodiment of an inventive laser amplifier system without illustration of the pumping radiation field;

DETAILED DESCRIPTION OF THE INVENTION

Figure 2:
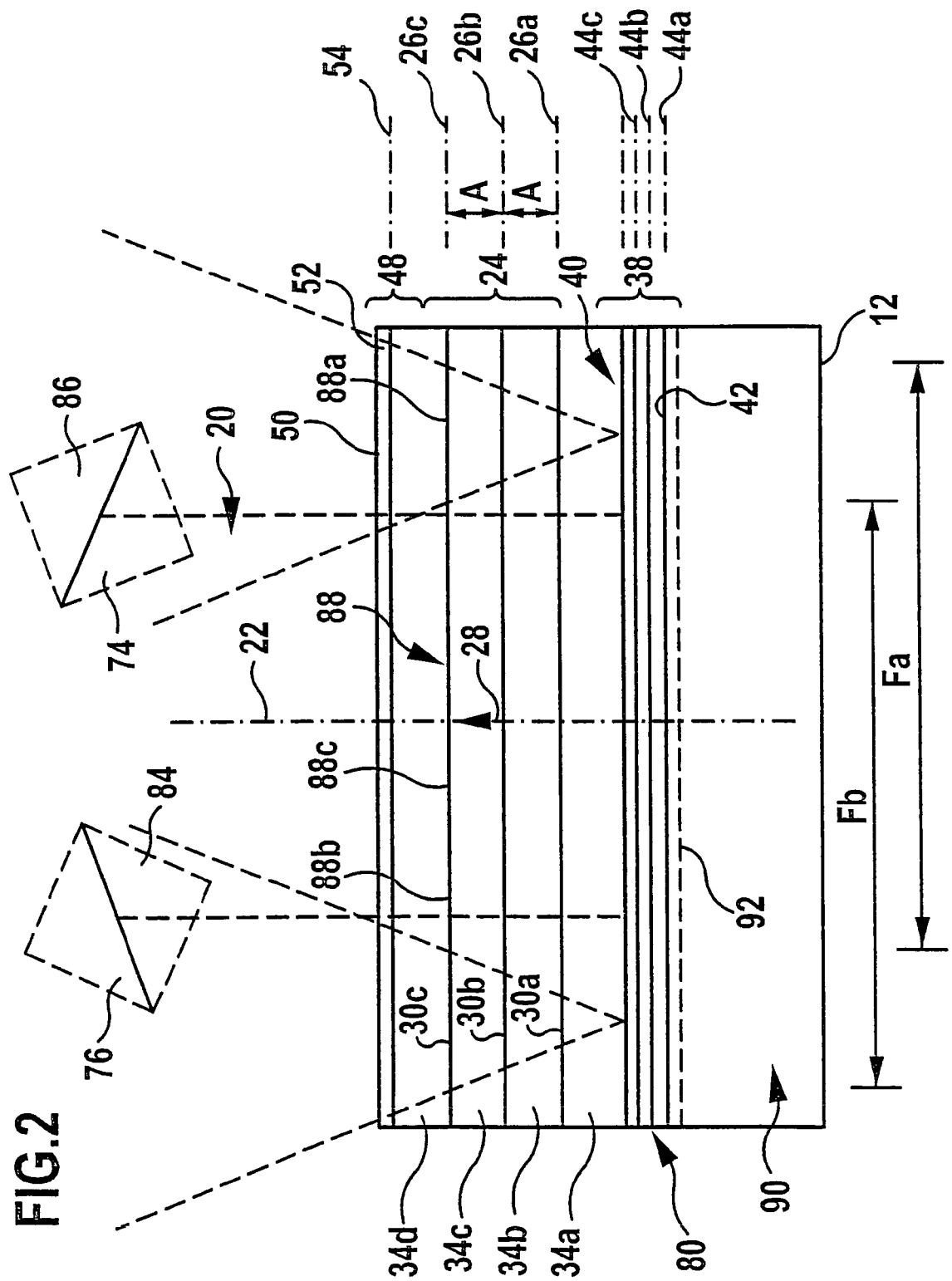
FIG. 2 shows an enlarged section through the solid-state body of the first embodiment of the inventive laser amplifier system illustrated in FIG. 1.

A first embodiment of an inventive laser amplifier system, illustrated in FIG. 1 and FIG. 2, comprises a solid-state body 10 which is arranged with a cooling surface 12 on an outer surface 14 of a cooling member 16, wherein a good thermal coupling results between the cooling member 16 and the solid-state body 10 due to the areal abutment of the cooling surface 12 on the outer surface 14.

The solid-state body 10 serves the purpose of the optical amplification of a laser amplifier radiation field 20 which passes through the solid-state body 10 and propagates, for example, along an optical axis 22.

In order to amplify the laser amplifier radiation field 20, a laser-active volume area 24 is provided—as illustrated in FIG. 2—in the solid-state body 10 and this laser-active volume area has amplifier structures which are designed as quantum structures 30$a$, 30$b$ and 30$c$ and extend in surfaces 26$a$ to 26$c$, which extend parallel to one another and are located one above the other, these amplifier structures being produced from a semiconductor material and having transversely to the surfaces 26 a thickness which is at the most in the order of magnitude of ten times, even better one times the wavelength of the electrons in the semiconductor material forming the quantum structure. Typically, the thickness of, for example, the semiconductor material GaAs is approximately 5 to approximately 100 nm but preferably approximately 5 to approximately 10 nm.

As a result, the quantum structures 30$a$ to 30$c$ determine an extension of an electron gas present in them and so an electron gas limited as to dimensions is present. The quantum structures 30$a$ to 30$c$ may, for example, be formed as films extending in the surfaces 26 and having a two-dimensional electron gas, as quantum wires extending in the surfaces 26 and having a one-dimensional electron gas or also as quantum points arranged in the surfaces 26 and having a zero-dimensional electron gas.

A description of such quantum structures is found, for example, in the book of Karl Joachim Ebeling, Integrated Optoelectronics, Springer Publishing House 1992, pages 215 to 221.

In this respect, the surfaces 26 preferably extend approximately parallel to the cooling surface 12 and preferably transversely to the optical axis 22, even better at right angles to the optical axis 22 of the laser amplifier radiation field 20, wherein the surfaces 26 have in a stacking direction 28 a distance A from one another which is in the order of magnitude of half the wavelength or an integral multiple of half the wavelength of the laser amplifier radiation field 20.

Alternatively to the equidistant arrangement of the surfaces 26, it is also possible to provide groups of surfaces lying extremely close to one another with quantum structures provided in them and to provide between the surfaces of different groups a distance A which is in the order of magnitude of the integral multiple of half the wavelength of the laser amplifier radiation field 20.

Since the quantum structures 30 are layers of semiconductor material, these are preferably located each time between surrounding structures 34$a$, 34$b$, 34$c$ and 34$d$ which adjoin the corresponding surface 26$a$ to 26$c$ on both sides, wherein the surrounding structures 34$a$ and 34$b$, for example, are arranged on either side of the surface 26$a$ and, therefore, enclose the quantum structure 30$a$ between them when viewed in the stacking direction 28.

The surrounding structures 34 also preferably consist of semiconductor material. It is particularly expedient when the surrounding structure has the same crystal structure and grating constant as the semiconductor material of the quantum structure 30 so that the semiconductor materials of the surrounding structures 34 are, preferably, essentially similar semiconductor materials.

In this respect, the surrounding structures 34 preferably have a thickness which is greater than the thickness of the quantum structure adjacent to them, even better a multiple of the quantum structure 30.

The surrounding structures 34 have, in particular, thicknesses, the minimum values of which are in the range of 10 nm to 100 nm.

The surrounding structures 34 which are located between two quantum structures 30 arranged so as to follow one another in the stacking direction 28 can form, altogether, an intermediate layer which defines the distance between the quantum structures 30 arranged so as to follow one another in stacking direction 28.

It is, however, also conceivable to provide an additional layer structure between two surrounding structures 34 following one another in the stacking direction 28, namely on their side respectively facing away from the quantum structure 30, so that, altogether, the intermediate layer is formed from the surrounding structures 34 and the intermediate structure located between them.

Figure 4:
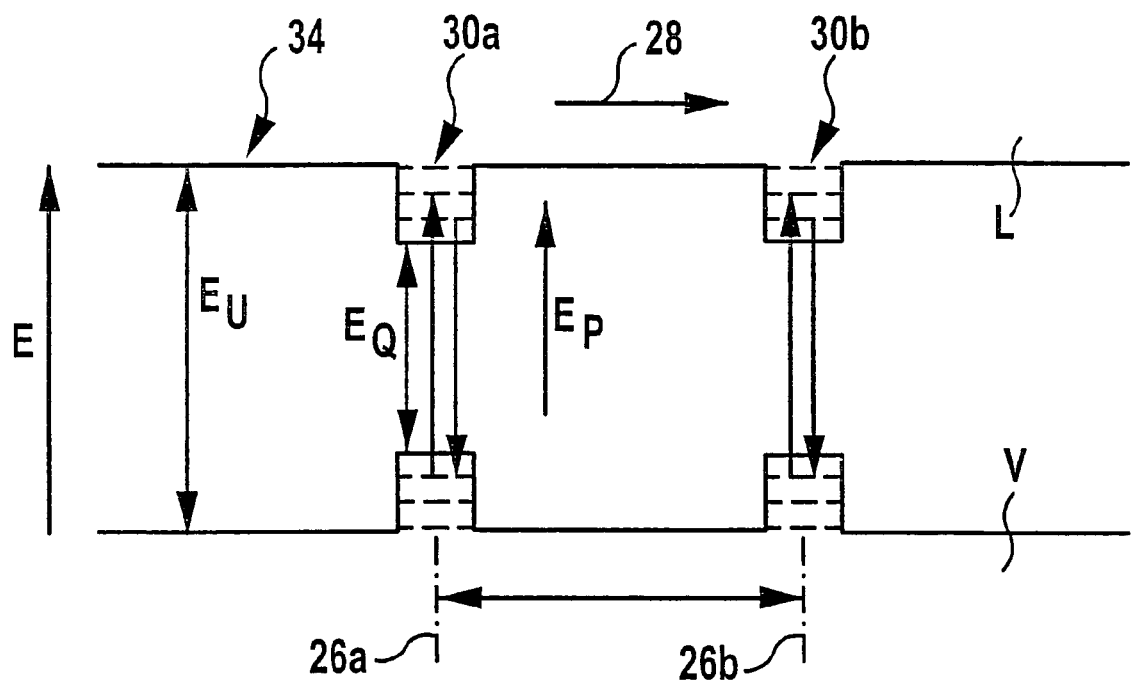
FIG. 4 shows a schematic illustration of energy relations between valence band and conduction band within the solid-state body, plotted against the distance in stacking direction.

However, as illustrated in FIG. 4, the band distance $E_U$ between the surrounding structures 34 is considerably greater than the band distance $E_Q$ between the quantum structures 30.

Preferably, the difference between the band distances $E_U$ and $E_Q$ is clearly disparate, as will be explained in the following in detail in conjunction with the optical pumping of the quantum structures 30.

In addition, the solid-state body 10 preferably comprises a reflecting volume area 38, in which several layers 42 are arranged which form a Bragg reflector 40 and likewise extend transversely, preferably at right angles, to the optical axis 22 in surfaces 44 which extend, in particular, essentially parallel to the surfaces 26.

The reflecting volume area 38 is arranged between the laser-active volume area 24 and the cooling surface 12.

Furthermore, the solid-state body 10 comprises, in addition, an antireflecting volume area 48 which is arranged on a side of the laser-active volume area 24 located opposite the reflecting volume area 38 and adjoins an exit surface 50 of the solid-state body 10 for the laser amplifier radiation field 20.

In this respect, the antireflecting volume area 48 is also preferably formed from at least one layer 52 which extends in a surface 54 which likewise extends, in particular, parallel to the surfaces 26 and the surfaces 44 and thereby transversely, preferably at right angles, to the optical axis 22.

In addition, the exit surface 50 is also designed such that this extends approximately parallel to the surfaces 26, 44 and 54.

The Bragg reflector 40 in the reflecting volume area 38 forms a mirror of an optical means of the amplifier designated as a whole as 60 whereas a second, for example, partially transparent mirror 62 of the optical means of the amplifier 60 is arranged at a distance from the exit surface 50, preferably at a large distance from it. The optical means of the amplifier 60 is designed such that the laser amplifier radiation field 20 customarily represents the laser amplifier radiation field 20 of the basic mode of the optical means of the amplifier 60 and possibly comprises additional higher modes but essentially only modes close to the basic mode.

The quantum structures 30 in the laser-active volume area 24 are pumped by a pumping radiation field which is designated as a whole as 70 and passes several times through the solid-state body 10 proceeding from a pumping radiation source 72.

For example, in the first embodiment a first branch 74 of the pumping radiation field 70 proceeds from the pumping radiation source 72 into the solid-state body 10, passes through the laser-active volume area 24 and thereby pumps the quantum structures 30 which are located within its cross section 76.

Subsequently, the pumping radiation field 70 is reflected at a reflector 80 for the pumping radiation field 70 and, therefore, the first branch 74 is imaged by the reflector 80 into a second branch 78 which proceeds from the reflector 80 in the direction of a deflecting mirror 82, wherein the second branch 78 also passes through the laser-active volume area 24 as a result and thereby pumps the quantum structures 30 located within its cross section optically. A return reflection of the pumping radiation field 70 takes place, for example, in the deflecting mirror 82 and, therefore, an imaging of the second branch 78 into a third branch 84 which proceeds in exactly the opposite direction to the second branch 78 and, again, enters the solid-state body 10, passes through the laser-active volume area 24, pumps the quantum structures 30 located within its cross section optically and is reflected at the reflector 80 and is, therefore, imaged into a fourth branch 84 of the pumping radiation field 70 which extends, proceeding from the reflector 80, in the direction of the pumping light radiation source 72 again and, therefore, passes once more through the laser-active volume area 24 and pumps the quantum structures 30 located within its cross section optically.

Altogether, the pumping radiation field 70 passes through the laser-active volume area 24 four times and so an efficient multiple pumping of the quantum structures 30 can take place even with low absorption of the pumping radiation field 70 by them.

The reflector 80 is, in the first embodiment illustrated, likewise designed as a Bragg reflector and is also formed by the Bragg reflector 40, i.e., the Bragg reflector 40 is dimensioned with respect to the number of and the distance between the layers 42 such that it is designed, on the one hand, to provide as good a reflection as possible for the laser amplifier radiation field 20 propagating along the optical axis 22 and, on the other hand, is designed to provide as good a reflection as possible for the pumping radiation field 70 incident at an acute angle in relation to the optical axis 22.

Since the two radiation fields 20, 70 impinge on the layers 42 at different angles, an optimization of the Bragg reflectors 40, 80 to two different wavelengths is possible.

In this respect, it is particularly favorable when the shorter wave radiation is incident at a greater angle of incidence than the long wave radiation.

Alternatively, it is, however, also possible within the scope of one variation to arrange the reflector 80 on a side of the Bragg reflector 40 facing away from the laser-active volume area 24, wherein, in this case, the Bragg reflector 40 must then be designed so as to be non-absorbing for the pumping radiation field.

Another possibility would also be to design the reflector 80 as a reflecting layer which is arranged, for example, so as to rest on the cooling surface 12.

As a result of the reflection of the pumping radiation field 70 and the formation of the branches 74 and 78 as well as 84 and 86 thereof, the surface 26c, in which the quantum structure 30c extends, is, for example, passed through, on the one hand, in a surface area 88a with a surface extension $F_a$, namely by the branches 74 and 86, and, on the other hand, in a surface area 88b with a surface extension $F_b$, namely by the branches 78 and 84.

In this respect, the surface areas 88a and 88b overlap to a great extent and provide, altogether, an interconnected excitation area 88 (FIG. 3), wherein an essentially homogeneous pumping of the quantum structure 30c takes place, however, only in the overlapping area 88c of the surface areas 88a and 88b and so the laser amplifier radiation field 20 preferably has, in the direction of the surface 26c, an extension which extends essentially over the overlapping area 88c of the surface areas 88a and 88b but does not, in particular, project beyond them.

The same considerations apply for the remaining quantum structures, for example, the quantum structures 30a and 30b in the surfaces 26b and 26a, wherein the quantum structure 30c which is removed the farthest from the reflector 80 has, however, the smallest overlapping area 88c of the surface areas 88a and 88b.

In FIGS. 1 and 2, the path of the branches 74, 76, 84, 86 relative to the optical axis 22 of the laser amplifier radiation field 20 is not illustrated realistically but only schematically insofar as the angle in relation to the optical axis 22 is smaller within the solid-state body 10 than outside the solid-state body on account of the higher index of refraction.

The solution illustrated in conjunction with the first embodiment, with which the pumping radiation field 70 passes several times through the respective quantum structure, represents the simplest case of such a guidance of the pumping radiation field 70.

More complex forms of guidance for the pumping radiation field 70 are described, for example, in European patent application No. 0 632 551 or in German patent application No. 100 05 195 or German patent application No. 198 35 107 or German patent application No. 198 35 108, to which reference is made in full with respect to the various possibilities for guiding the pumping radiation field.

In the case of the inventive solution, the band distance $E_Q$ between the upper valence band V and the lower conduction band L of the semiconductor material forming the quantum structures 30 is, as already explained on the basis of FIG. 4, clearly smaller than the band distance $E_U$ of the semiconductor material forming the surrounding structures 34 and so it is possible to select the light wavelength and, therefore, the energy of the photons $E_P$ of the pumping radiation field 70 such that only an optical pumping of the semiconductor material of the quantum structures 30 takes place with the pumping radiation field 70 and, preferably, no optical pumping of the semiconductor material of the surrounding structures 34 and also no optical pumping of other materials forming the solid-state body 10.

On the contrary, the solid-state body 10 is built up such that the solid-state body 10, apart from the quantum structures 30 and the reflector 80, has as good a transparency as possible for the pumping radiation field 70 and the laser amplifier radiation field 20.

The inventive solid-state body 10 is preferably produced on a substrate 90 by way of epitaxy, wherein the reflecting volume area 38 with the layers 42 forming the Bragg reflectors 40, 80 is built up first of all directly on the substrate 90, followed, for example, in the simplest case by the surrounding structure 34, to which the quantum structure 30a is then applied. This quantum structure 30a is then followed by additional surrounding structures, for example, the surrounding structure 34b, then again the surrounding structure 34c, on this the quantum structure 30c and, finally, the surrounding structure 34d. However, even more quantum structures 30 and surrounding structures can also follow one on top of the other and they all form the laser-active volume area 24.

Finally, the antireflecting volume area 48 with, for example, an antireflective layer 52 is applied to this laser-active volume area 24.

Where applicable, additional function layers, such as, for example, passivation layers are provided between the laser-active volume area 24 and the antireflecting volume area 48.

In order to couple the entire solid-state body to the cooling member 16 as favorably as possible via the cooling surface 12, as thin a substrate 90 as possible is preferably selected or material is removed from the substrate 90 again after the build up of the reflecting volume area 38, the laser-active volume area 24 and the antireflecting volume area 48 as far as a caustic stop layer 92 which is provided, for example, on the substrate 90 immediately prior to application of the reflecting volume area 38.

As a result, it is possible to keep the distance between the cooling surface 12 and the reflecting volume area 38 as small as possible and, therefore, also the distance between the cooling surface 12 and the laser-active volume area 24 which is heated up on account of the absorption of the pumping radiation field 70 and, therefore, needs to be cooled as efficiently as possible.

In general, the aim is for the distance between the reflecting volume area 38 and the cooling surface 12 of the solid-state body 10 to be, as far as possible, less than 100 μm.

In a second embodiment of an inventive laser amplifier system, illustrated in FIG. 5, the solid-state body 10' is preferably built up such that first of all the laser active volume area 24 is built up on the substrate 90 and, subsequent thereto, the reflecting volume area 38 so that the reflecting volume area 38 forms the last layers applied to the solid-state body 10 and the cooling surface 12 of the solid-state body 10' is then formed by the uppermost layer of the reflecting volume area 38 so that when the solid-state body 10' is placed on the outer surface 14 of the cooling member 16 with the cooling surface 12 the distance between the reflecting volume area 38 and the cooling surface 12 can be the slightest possible.

In this second embodiment, the antireflecting volume area 48 is subsequently formed by an antireflective layer which is applied to a side of the substrate 90 located opposite the laser-active volume area 24 and forms the exit surface 50.

With respect to the features not explained in detail, the second embodiment is designed in the same way as the first embodiment and so reference can be made in full to the comments concerning the first embodiment.

Figure 6:
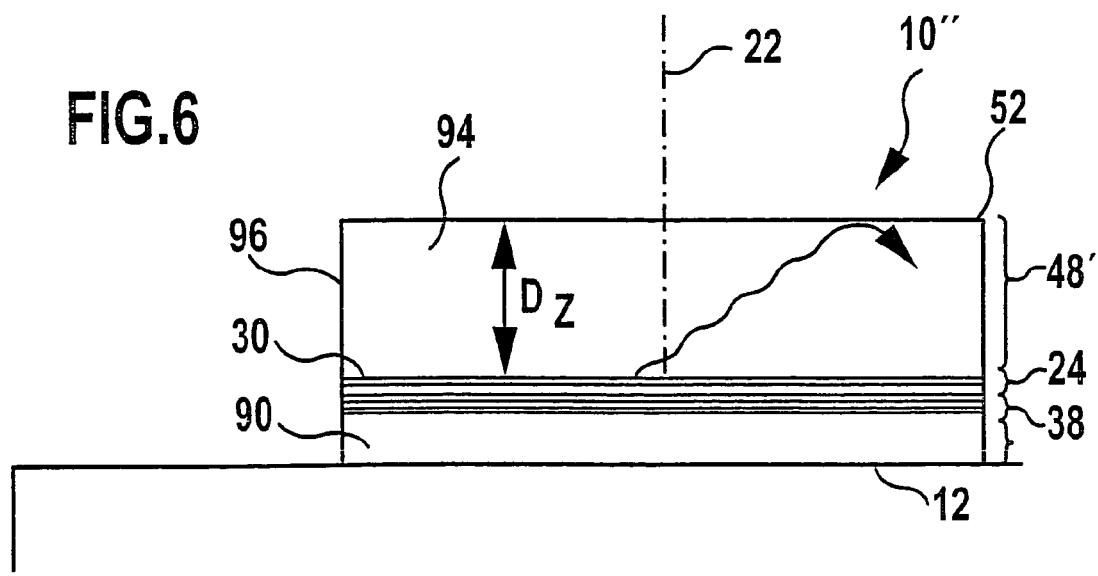
FIG. 6 shows a schematic illustration of an attenuation of radiation having the wavelength of laser amplification and propagating in a direction transverse to the optical axis in a third embodiment of an inventive laser amplifier system.

In a third embodiment of an inventive laser amplifier system, illustrated in FIG. 6, to avoid any wave guidance transversely to the optical axis 22 of the laser amplifier field, in particular, in the antireflecting volume area 48', this is designed such that an optically inactive intermediate area 94 is present between the quantum structure 30 located closest to this antireflecting volume area 48' and the antireflective layer 52 and this intermediate area has a thickness $D_Z$ which amounts to a multiple of the wavelength of the radiation in the laser amplifier radiation field 20 so that no favorable amplification ratios in the direction of a side wall 96 of the solid-state body 10 are present between the quantum structure 30 located closest to the antireflecting volume area 48' and the antireflective layer 52 which, in this case, acts as a reflector layer.

With respect to the remaining features not described in detail, the third embodiment is also designed in the same way as the first and the second embodiments and so reference can be made in full to the comments concerning these embodiments.

As explained in conjunction with the first embodiment and illustrated in FIGS. 1 and 2, the surfaces 26, in FIG. 2 the surfaces 26a and 26b, in which the quantum structures 30, in FIG. 2 the quantum structures 30a and 30b, extend, have a distance between them in stacking direction 28 which corresponds preferably to half the wavelength of the laser amplifier radiation field 20 or an integral multiple of half the wavelength of the laser amplifier radiation field 20 and so it is, therefore, ensured that the laser amplifier radiation field 20, which propagates in the direction of the optical axis 22, is always amplified at places of maximum amplitude by way of the quantum structures 30.

Figure 7:
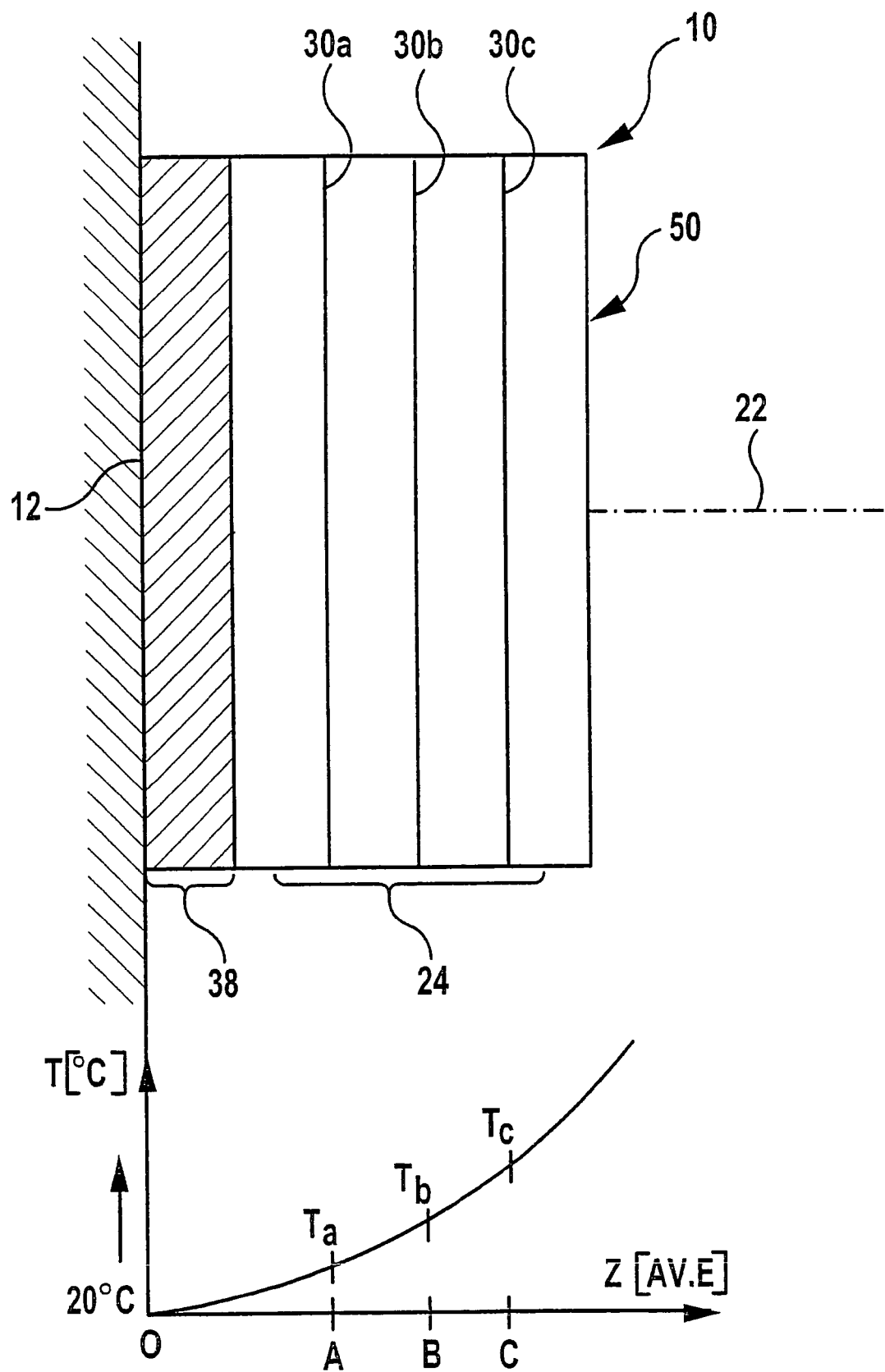
FIG. 7 shows a schematic illustration of a distribution of temperature in the solid-state body in the thermodynamic state of equilibrium during laser operation in a fourth embodiment of the inventive laser amplifier system.

Since it has likewise been explained in conjunction with the first embodiment that the discharge of the heat has to take place essentially over the entire surface of the cooling surface 12, it results therefrom in the case of a fourth embodiment illustrated in FIG. 7 that a temperature gradient extending in the solid-state body 10 in the direction of the optical axis 22 occurs which is essentially equal in all directions transverse to the optical axis 22 in all the areas within the laser amplifier radiation field 20 and so the temperature in the solid-state body 10 rises with increasing distance from the cooling surface 12, as illustrated in FIG. 7. In the case of the quantum structures 30a, 30b and 30c, this results in the temperature $T_a$ of the quantum structure 30a being lower than the temperature $T_b$ of the quantum structure 30b and the temperature $T_b$ being lower than the temperature $T_c$ of the quantum structure 30c.

Such a temperature gradient in the solid-state body 10 results, in the case of most semiconductor materials, in the band distance between the valence band V for the holes and the conduction band L for the electrons becoming smaller with increasing temperature.

Figure 8:
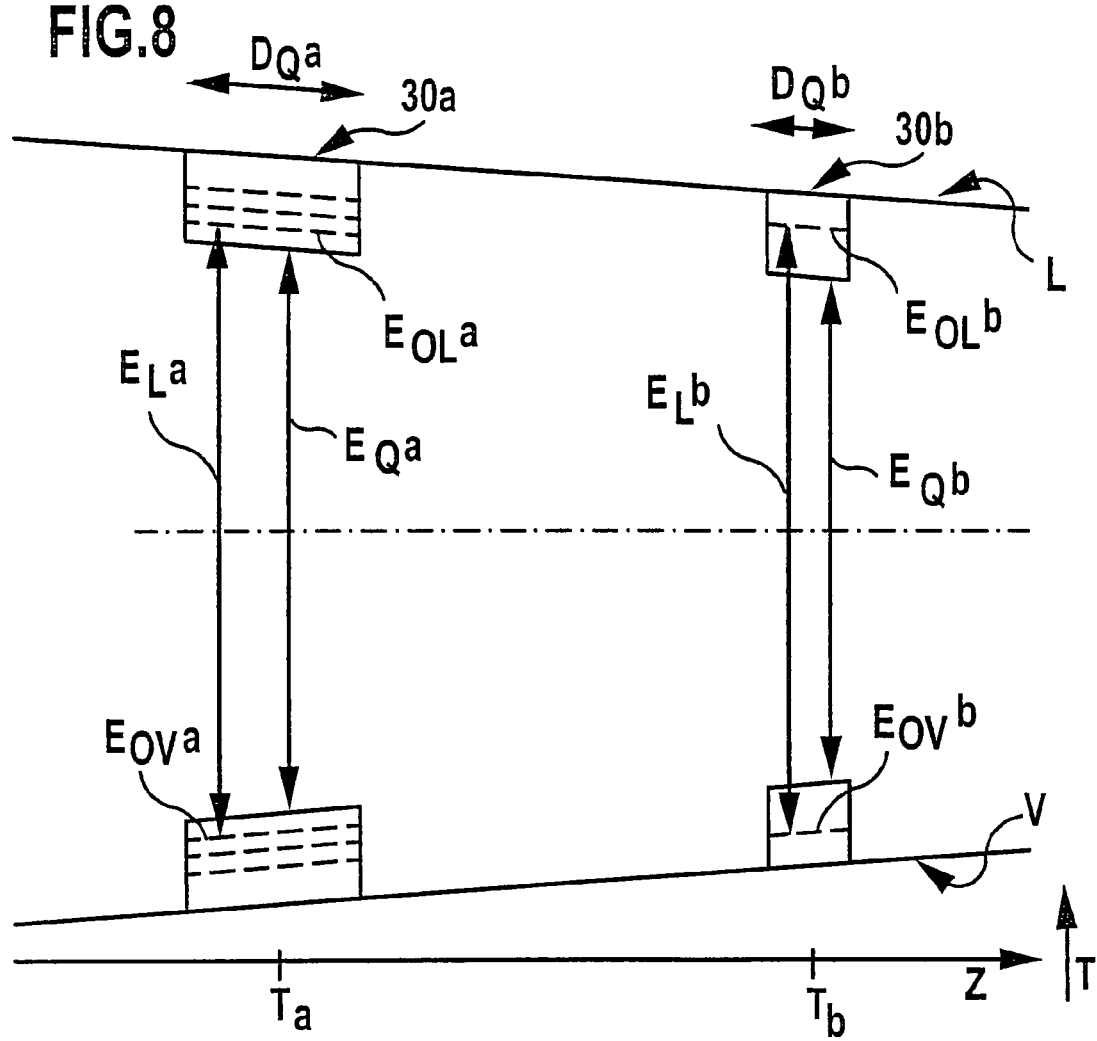
FIG. 8 shows a schematic illustration similar to FIG. 4 of the energy relations between valance and conduction bands as a function of the temperature in the fourth embodiment.

For this reason, the band distance $E_Q b$ of the quantum structure 30b is, for example, smaller than the band distance $E_Q a$ of the quantum structure 30a (FIG. 8).

The energy, with which light is emitted by a respective quantum structure 30, does not, however, depend on the band distance $E_Q$ but rather on the band distance $E_Q$ plus the respective zero point energy $E_{OL}$ for the electrons and $E_{OV}$ for the holes. As a result, it is possible to vary the energy of the emitted light $E_L$ by shifting the zero point energy in the individual quantum structures 30, for example, the quantum structures 30a and 30b and, therefore, to enable the energy $E_L$a of the emitted light of the quantum structure 30a to be approximately equal to the energy $E_L$b of the quantum structure 30b although the band distance $E_Q$a is greater than the band distance $E_Q$b. Such a variation in the zero point energy $E_{OL}$ in the conduction band and $E_{OV}$ in the valence band may be brought about in that either the composition and/or the extension in the direction of limited dimensions, for example, the thickness of the respective two-dimensional quantum structure 30, for example, the quantum structure 30a or 30b are varied (FIG. 8).

As a result, it is possible, despite different temperatures $T_a$, $T_b$, $T_c$ in the individual quantum structures 30, for example, the quantum structures 30a, 30b and 30c, for the energy of the emitted laser radiation $E_L$ to be essentially equal in all the quantum structures 30, for example, the quantum structures 30a, 30b, 30c so that an optimum amplification of the laser amplifier radiation field 20 takes place.

As for the rest, the laser amplifier system is, in this embodiment, of an identical construction to the first embodiment and so reference can be made in full to the explanations concerning the first embodiment.

Figure 9:
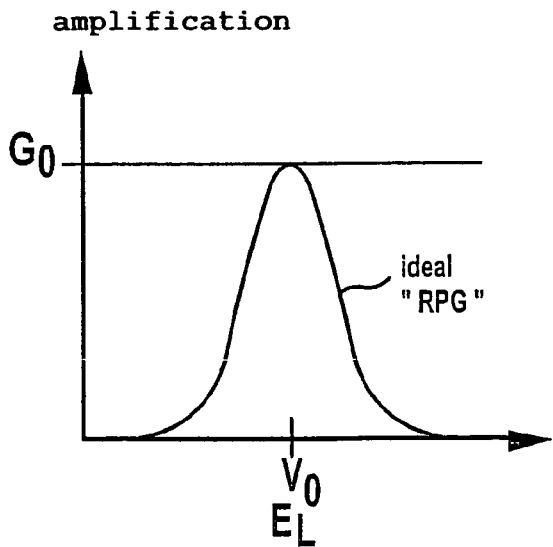
FIG. 9 shows a schematic illustration of an amplification profile of the fourth embodiment with an ideal distance between the quantum structures in the direction of propagation of the laser amplifier radiation field.

As a result of taking these different temperatures $T_a$, $T_b$, $T_c$ into consideration, an amplification profile is achieved in the laser amplifier radiation field 20, as illustrated in FIG. 9, which has a slight band width around the energy $E_L$, to which the frequency $f_0$ corresponds.

Figure 10:
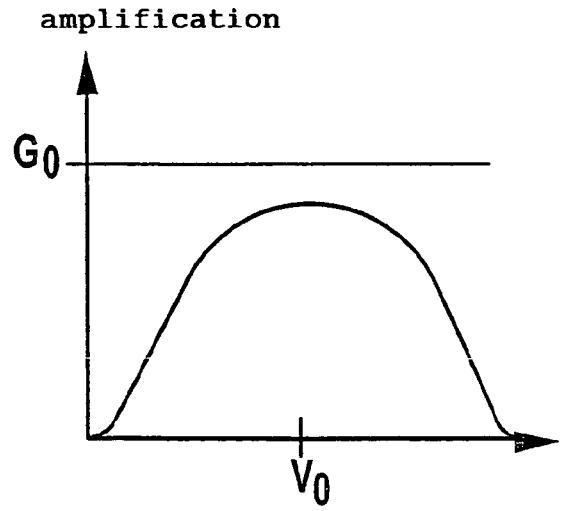
FIG. 10 shows an illustration of an amplifier profile in a fifth embodiment of an inventive laser amplifier system.
Figure 11:
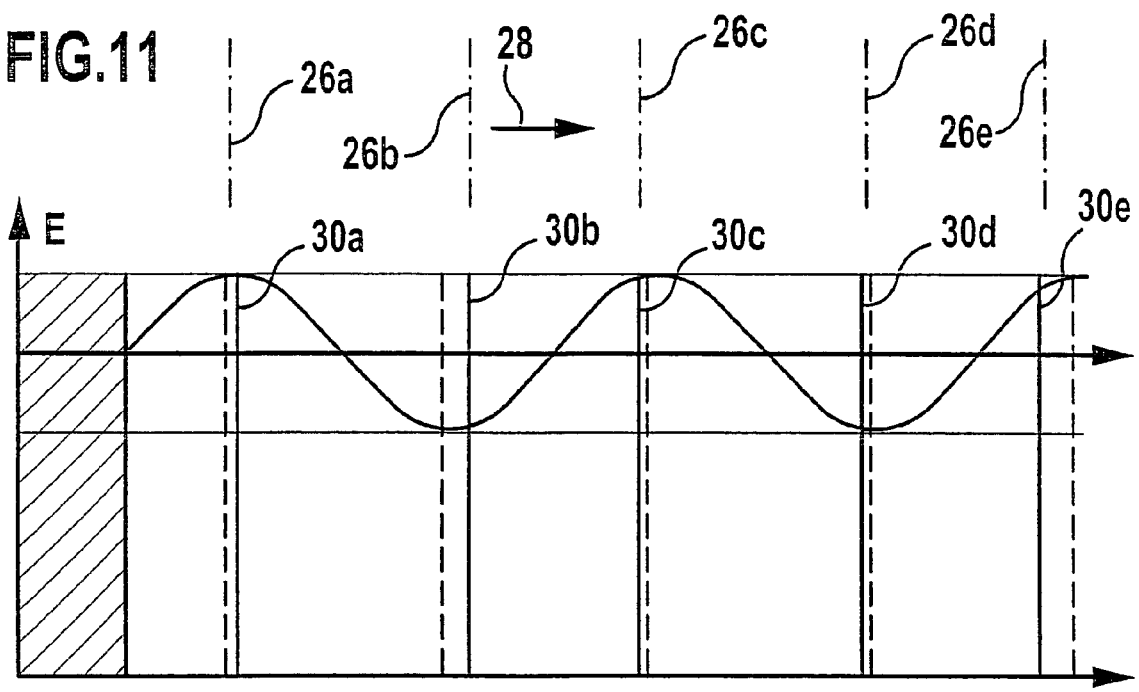
FIG. 11 shows a schematic illustration of an arrangement of the quantum structures in the fifth embodiment deviating from the ideal arrangement with a schematic illustration of the associated electric field distribution of the laser mode.

If, however, it is necessary, as illustrated in FIG. 10, to obtain an amplification profile which is broadened spectrally around the frequency $f_0$, it is provided in a fifth embodiment illustrated in FIG. 11 for the surfaces 26, in which the quantum structures 30 are located, to be arranged in stacking direction 28 not exactly at the distance of half the wavelength of the laser amplifier radiation field 20 or of an integral multiple of half the wavelength but rather to have varying distances due to slight deviations from half the wavelength. For example, the quantum structure 30b in the surface 26b is arranged at a distance from the quantum structure 30a, which extends in the surface 26a, which is greater than half the wavelength whereas the quantum structure 30c which extends in the surface 26c is, again, arranged such that it is arranged approximately at the distance of a multiple of half the wavelength from the quantum structure 30a.

The same applies for the quantum structure 30d which extends in the surface 26d whereas for the quantum structure 30e, which extends in the surface 26e, the distance from the quantum structure 30a is, again, somewhat smaller than the integral multiple of half a wavelength.

As a result, it is not only possible, in the laser-active volume area 24, for a laser amplifier radiation field 20 to be amplified with exactly the predetermined wavelength but wavelengths are also amplified which deviate from the exactly predetermined wavelength.

In the case of the embodiments described thus far, it has been assumed, as illustrated in FIG. 3, that the excitation of a quantum structure 30 in each of the surfaces 26 takes place such that a uniform, interconnected surface area 88 is optically pumped by the pumping radiation field 70.

Figure 12:
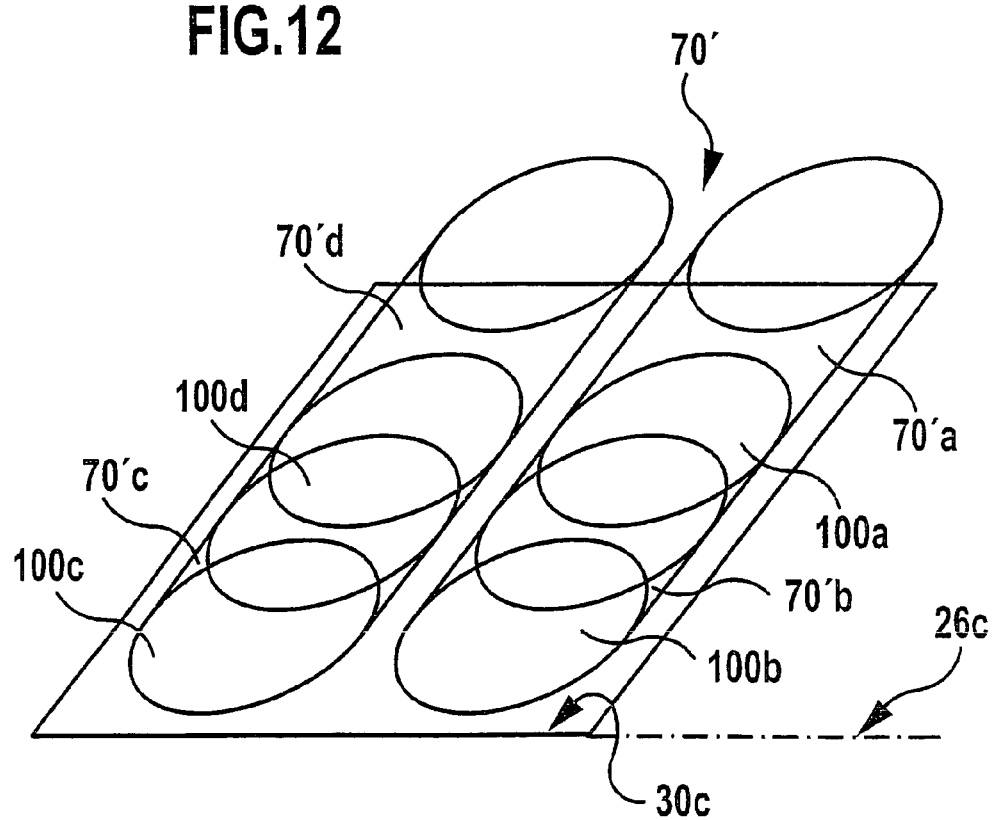
FIG. 12 shows a schematic illustration of a quantum structure of a sixth embodiment of the inventive laser amplifier system located in a surface.

Alternatively thereto, it is possible in a sixth embodiment illustrated in FIG. 12 to excite the quantum structure 30, for example, likewise the quantum structure 30c which extends in the surface 26c but also all the additional quantum structures 30 with a pumping radiation field 70' which has radiation field segments 70'a, 70'b, 70'c and 70'd which pass through the surface 26 in partial surface areas 100a, 100b, 100c and 100d which are separated from one another and so an excitation of the quantum structure 30c which extends essentially over the entire cross section of the solid-state body 10 takes place merely in the partial surface areas 100a to 100d whereas the areas of the quantum structure 30c located between these partial surface areas 100a to 100d which are separated from one another are not pumped optically.

This creates the possibility of optimizing the optical amplification of the quantum structure 30 provided in a surface in a simple manner without allowing the extension of an optically pumped area to become all too great and, therefore, of obtaining an undesired optical amplification in a direction parallel to the surface 26.

Figure 13:
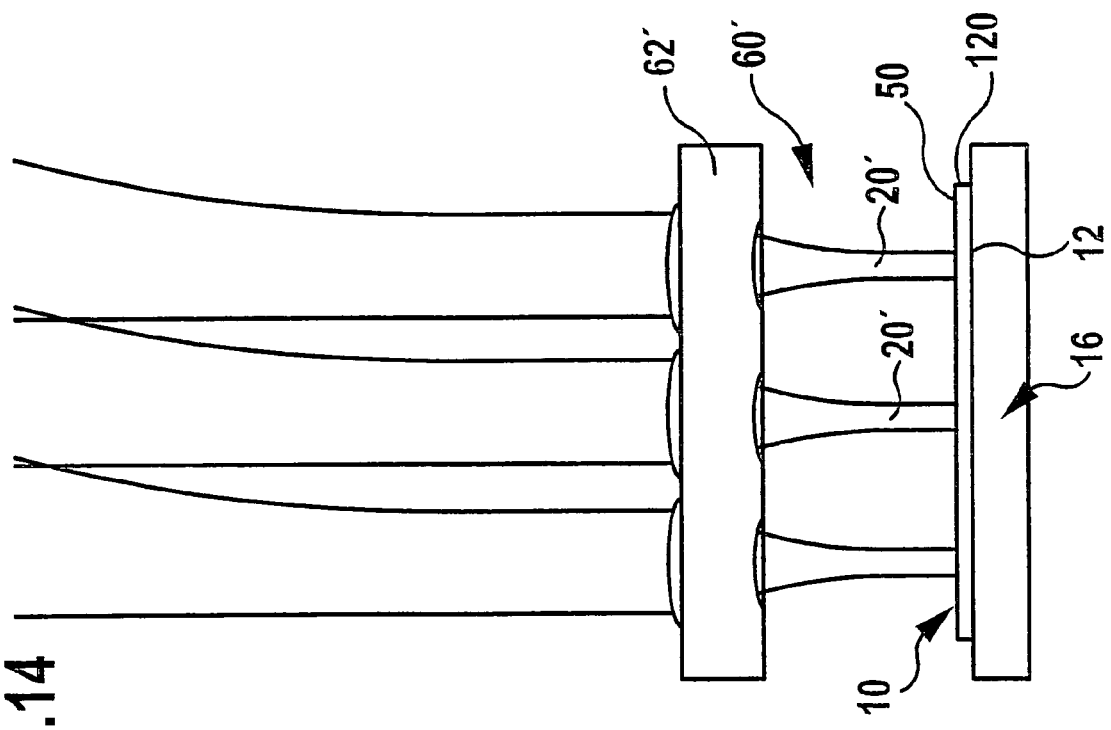
FIG. 13 shows a schematic illustration of a variation of an optical means of the amplifier of the sixth embodiment.

The quantum structures 30 excited with such a pumping radiation field 70' therefore form individual laser amplifier radiation fields 20' which, as illustrated in FIG. 13, are independent of one another.

These laser amplifier radiation fields illustrated in FIG. 13 may, however, be coupled to one another by way of external coupling measures, for example, partially transparent mirrors and use of one of the laser amplifier radiation fields 20' as a master radiation field.

Figure 14:
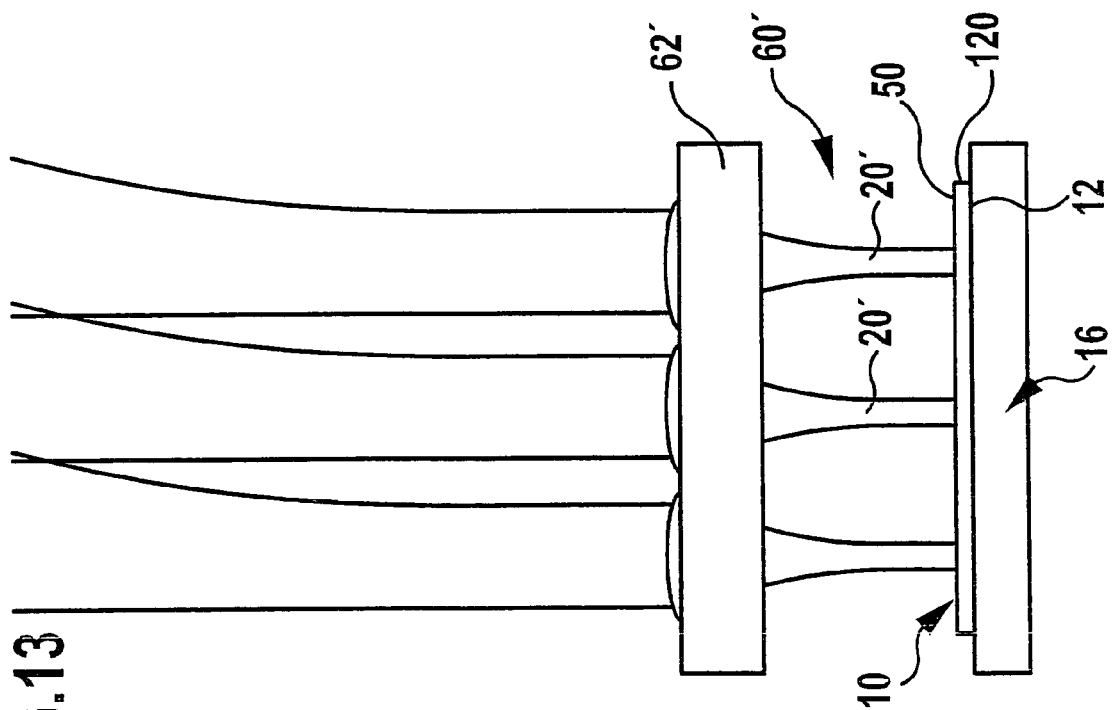
FIG. 14 shows a schematic illustration of a second variation of an optical means of the amplifier of the sixth embodiment.

Alternatively to the provision of an external coupling, an internal coupling provides for the individual laser amplifier radiation fields 20', which are amplified by the individual, optically excited surface areas 100a to 100c of the quantum structure 30c, to be combined by means of a suitable optical means 60' of the amplifier, for example, in the form of a Talbot resonator to form a coherent output radiation field 102, as illustrated in FIG. 14.

A Talbot resonator of this type is described, for example, in the article of Uwe Brauch, P. Loosen, H. Opower, "High-Power Diode Lasers for Direct Applications" in: R. Diehl (ed.), High-Power Diode Lasers, Topics Appl. Phys. 78, Springer Publishing House, Berlin Heidelberg, 2000, pages 303-367 in conjunction with FIG. 37.

Such a pumping radiation field 70' comprising radiation field segments 70'a to 70'd may be generated either by a single pumping radiation source and splitting of its radiation or by several pumping radiation sources. The light for forming the pumping radiation field 70 is preferably guided via light guides and their ends on the exit side are positioned relative to one another in accordance with the desired arrangement of the radiation field segments 70'a to 70'd in order to obtain, altogether, the pumping radiation field 70'.

As for the rest, the solid-state body 10 and the quantum structures 30 may be designed in the same way as in the preceding embodiments and so this will not be discussed in detail but rather reference is made in full to the preceding explanations.

Figure 15:
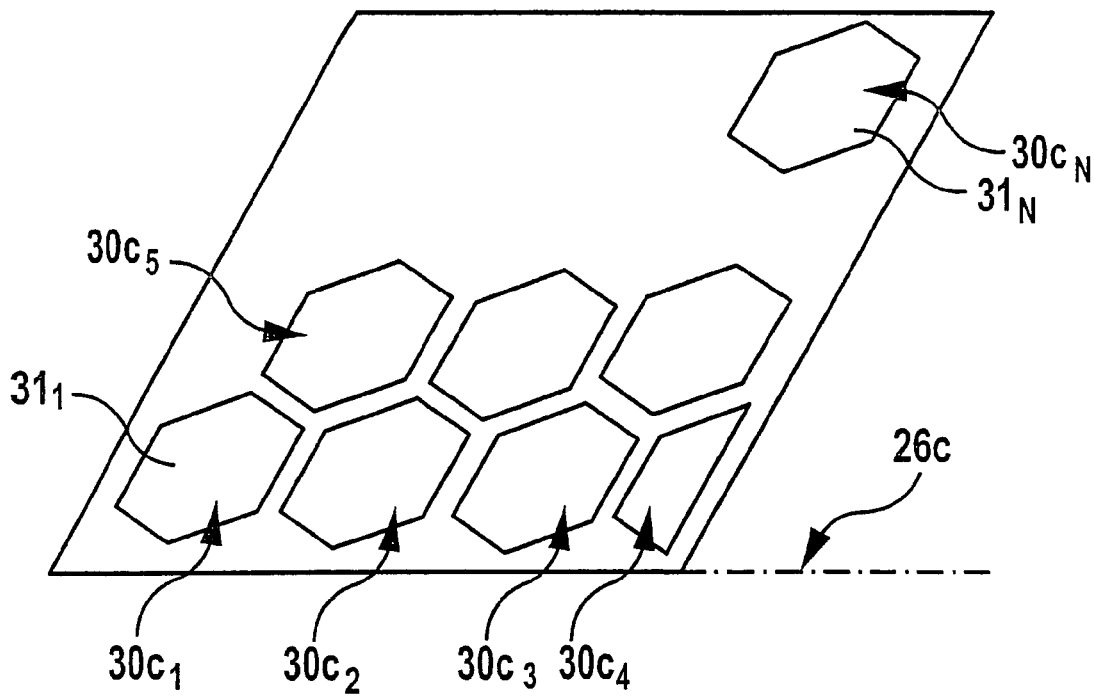
FIG. 15 shows a schematic illustration of a quantum structure of a seventh embodiment arranged in a surface.

In a seventh embodiment of an inventive laser amplifier system, illustrated in FIG. 15, it is not one interconnected quantum structure 30c which is provided in each of the surfaces, in FIG. 15 the surface 26c by way of example, but rather a plurality of individual quantum structures $30_1$ to $30_N$, in this case $30c_1$ to $30c_N$, which all cover individual partial surface areas $31_1$ to $31_N$ of the surface 26c which are separated from one another.

In the seventh embodiment illustrated in FIG. 15, the individual quantum structures $30_1$ to $30_N$ arranged in the respective surface 26 are still areal quantum structures, i.e., quantum films and so the electron gas present in them is still a two-dimensional electron gas.

Such areal quantum structures $30_1$ to $30_N$ in the respective surface 26 may be achieved, for example, by way of a suitable material composition in the partial surface areas $31_1$ to $31_N$.

Figure 16:
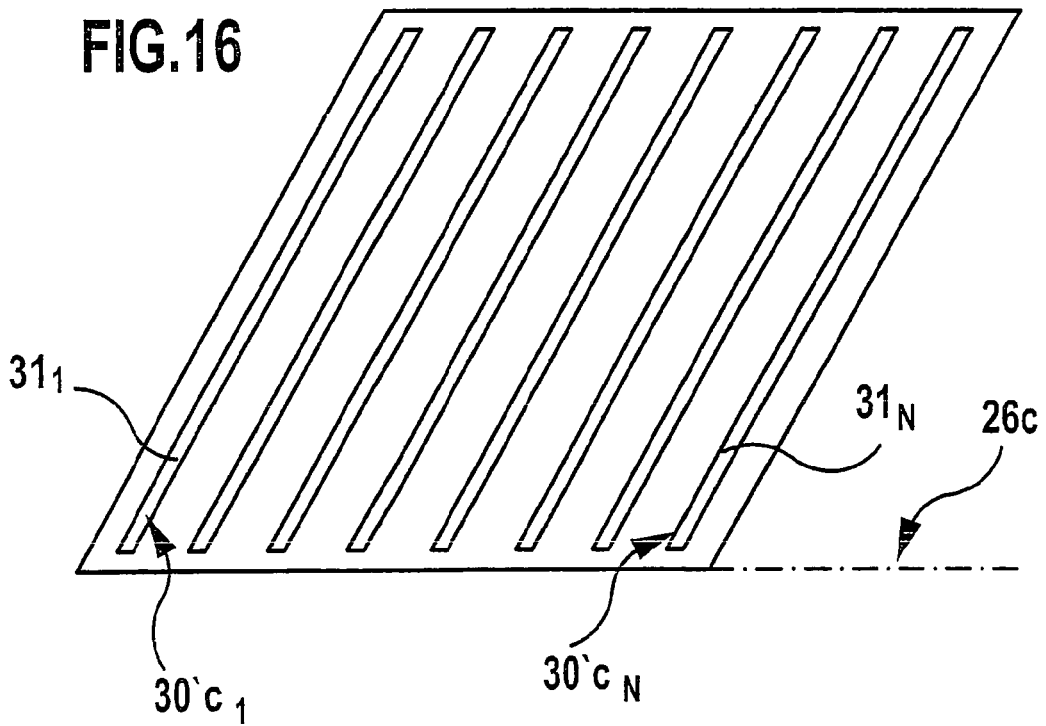
FIG. 16 shows a schematic illustration of a quantum structure of an eighth embodiment arranged in a surface.

In an eighth embodiment, illustrated in FIG. 16, a plurality of quantum structures $30'_1$ to $30'_N$ is likewise provided in each of the surfaces 26 in the illustration $30'c_1$ to $30'c_N$. In this case, the quantum structures $30'_1$ to $30'_N$ are not, however, areal quantum structures but rather so-called quantum wires, in which a two-dimensional electron gas is no longer present but rather only a one-dimensional, namely in longitudinal direction of the respective quantum wire $30'_1$ to $30'_N$.

Preferably, quantum wires $30_1$ to $30_N$ of this type may also be achieved by means of suitable doping in the partial surface areas $31_1$ to $31_N$ of the respective surface 26.

In this respect, the quantum wires $30_1$ to $30_N$ preferably have in a direction transverse to their longitudinal direction a width which is in the order of magnitude of their thickness at right angles to the surface 26.

Figure 17:
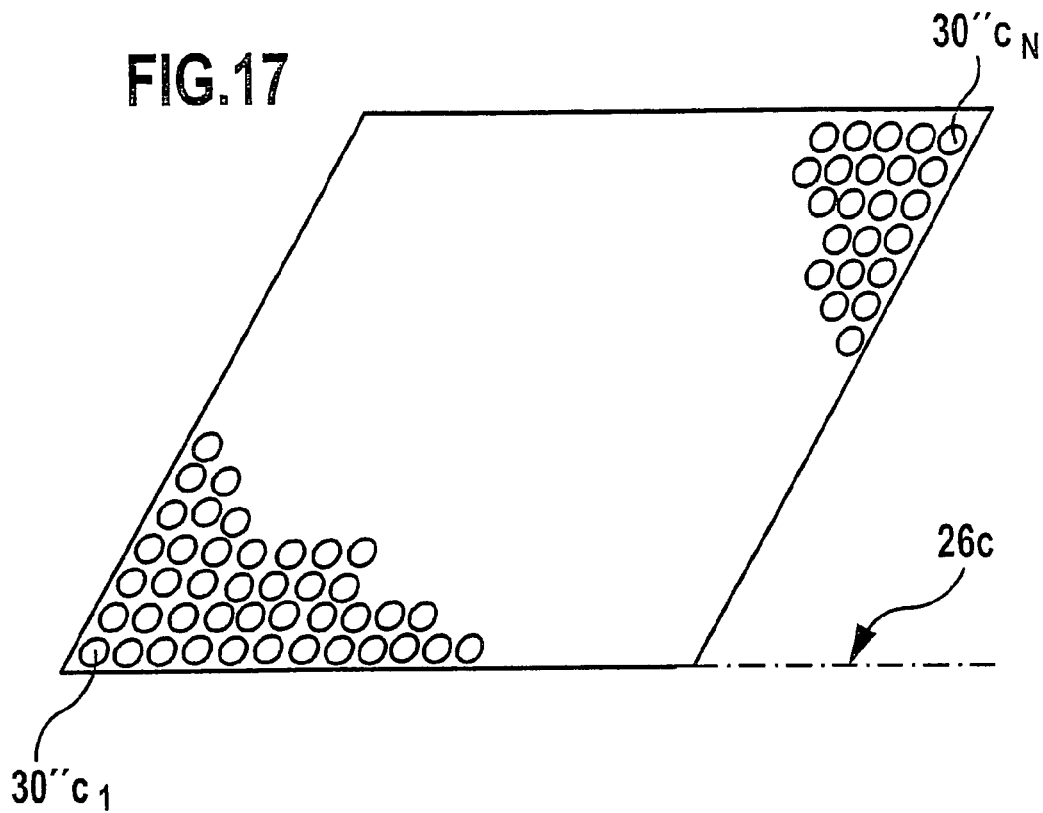
FIG. 17 shows a schematic illustration of a quantum structure of a ninth embodiment of an inventive laser amplifier system arranged in a surface.

In a ninth embodiment illustrated in FIG. 17, the quantum structures $30''_1$ to $30''_N$, for example, the quantum structures $30''c_1$ to $30''c_N$ illustrated in FIG. 17 and provided in the respective surface 26, for example, the surface 26c are neither quantum films nor quantum wires but rather so-called quantum points, in which a so-called zero-dimensional electron gas is present, wherein these quantum points have in the respective surface 26 maximum extensions which are in the order of magnitude of their thickness transversely to the surface 26.

In the case of the seventh, eighth and ninth embodiments, reference is made in full to the comments on the previous embodiments insofar as the remaining features of the quantum structures 30, the solid-state body 10, the guidance of the laser amplifier radiation field 20 and the pumping radiation field 70 are concerned.

Figure 18:
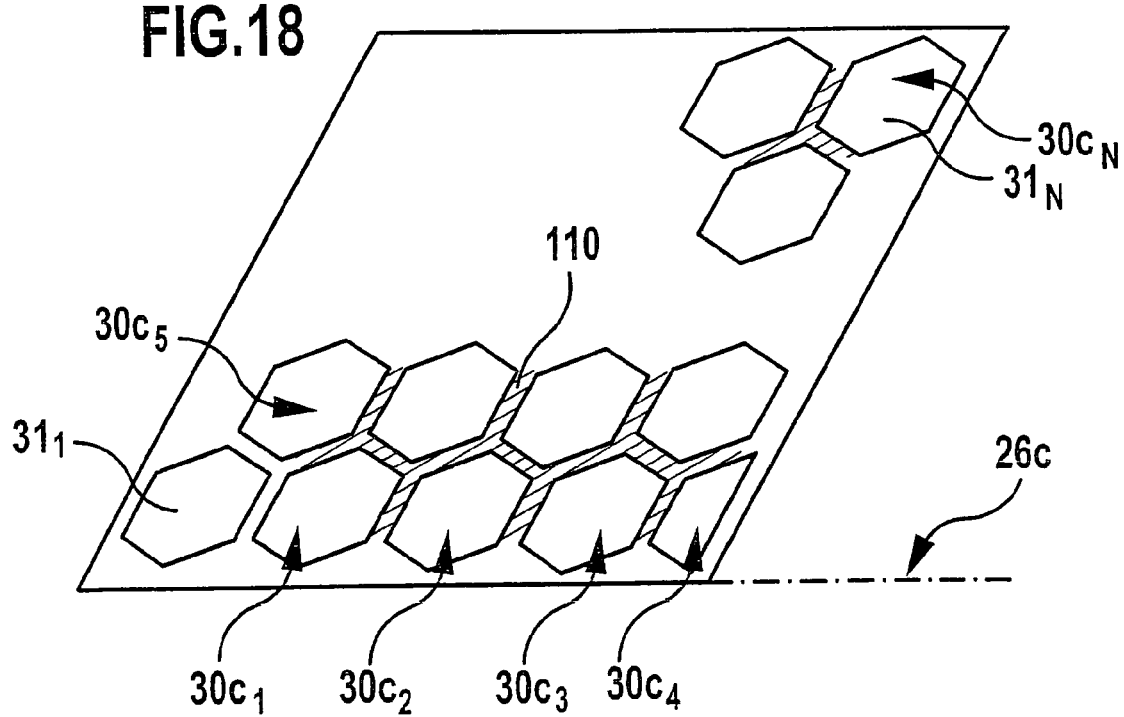
FIG. 18 shows a schematic illustration of a quantum structure of a tenth embodiment of an inventive laser amplifier system arranged in a surface.

A tenth embodiment illustrated in FIG. 18 is based on the embodiment according to FIG. 15, wherein in this embodiment the spaces 110 between the individual quantum structures $30_1$ to $30_N$, in this case the quantum structures $30c_1$ to $30c_N$, have a highly absorbing material as barrier 114 in order to avoid any amplification in a direction parallel to the surface 26.

Figure 19:
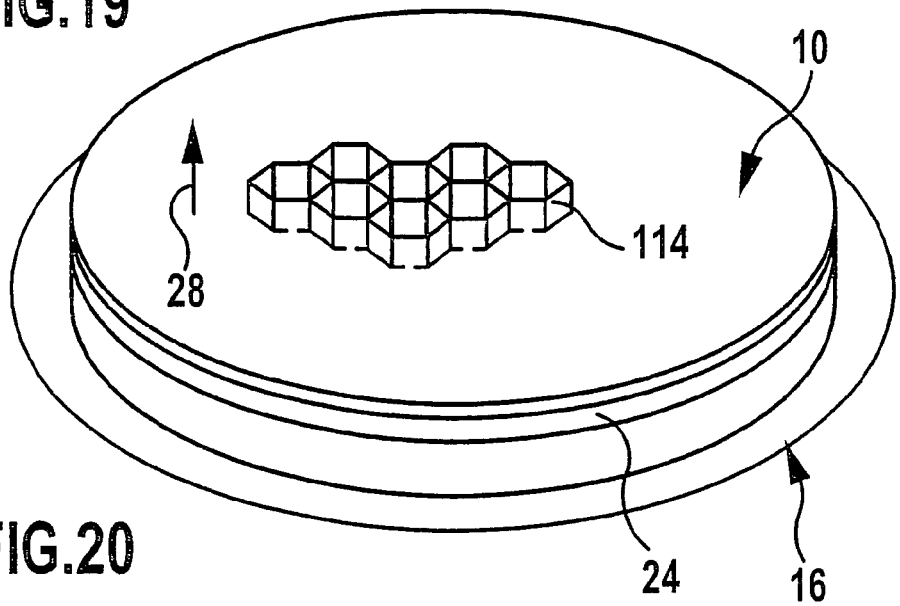
FIG. 19 shows a schematic sectional illustration of barriers extending in stacking direction over the laser-active volume area in the tenth embodiment.

In this respect, as illustrated in FIG. 19, it is preferably provided for the material which absorbs considerable radiation at the wavelength of the laser amplifier radiation field 20 to form in the spaces 110 barrier walls 114 which extend in the direction of the stacking direction 28 at least over the extension of the laser-active volume area 24 and, therefore, also prevent the formation of any amplifier radiation field in a direction parallel to the surface 26 in the area, for example, of the surrounding structures 34.

With respect to the tenth embodiment, as well, reference is made to the preceding embodiments with respect to the remaining features.

Figure 20:
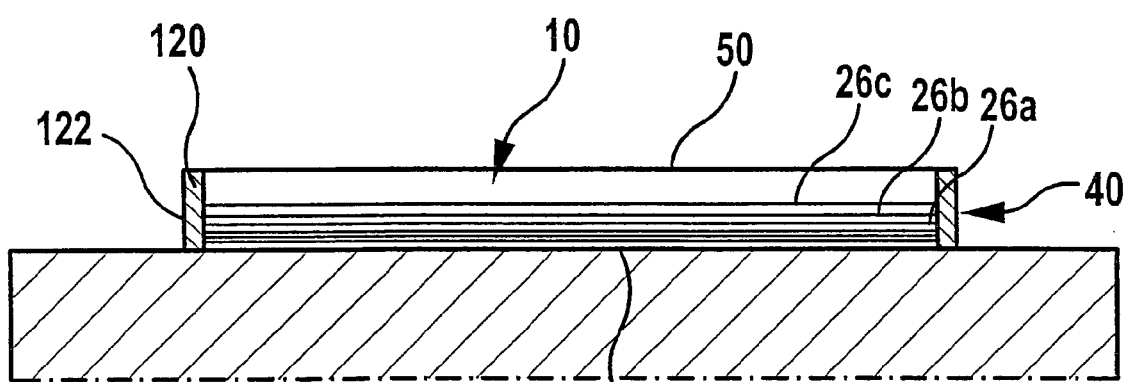
FIG. 20 shows a schematic illustration similar to FIG. 1 of an eleventh embodiment.

In general, in order to suppress the formation of any amplifier radiation field in a direction parallel to the respective surfaces 26, it is preferably provided in an eleventh embodiment illustrated in FIG. 20 for the solid-state body 10 to be provided in the area of its side surfaces 120 extending between the cooling surface 12 and the exit surface 50 with an antireflective layer 122 which surrounds the entire solid-state body 10 in the area of the side surfaces 120 and prevents radiation propagating in the direction of the surfaces 26 from being reflected back and, therefore, amplified again.

Figure 21:
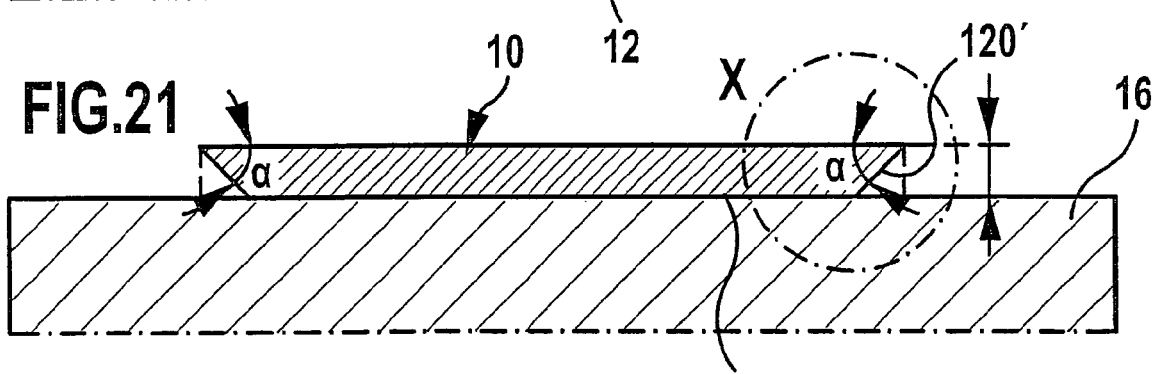
FIG. 21 shows a schematic illustration similar to FIG. 1 of a twelfth embodiment.
Figure 22:
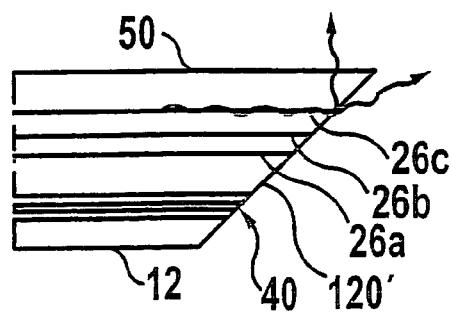
FIG. 22 shows an enlarged sectional illustration of an area X in FIG. 21.

Alternatively thereto, it is provided in a twelfth embodiment illustrated in FIGS. 21 and 22, instead of the antireflective layer 122, for the side surface 120' to extend in relation to the surfaces 26 at an angle which corresponds to the angle of maximum coupling out for light of the wavelength of the laser amplifier radiation field 20 and so light propagating parallel to the surfaces 26 in the area of the side surfaces 120' is likewise not reflected back but rather exits from the solid-state body 10 and a resonant amplification of radiation propagating parallel to the surfaces 26 can, therefore, likewise be avoided.

Reference is made to the comments on the preceding embodiments also with respect to the additional features of the eleventh and twelfth embodiments.

Figure 23:
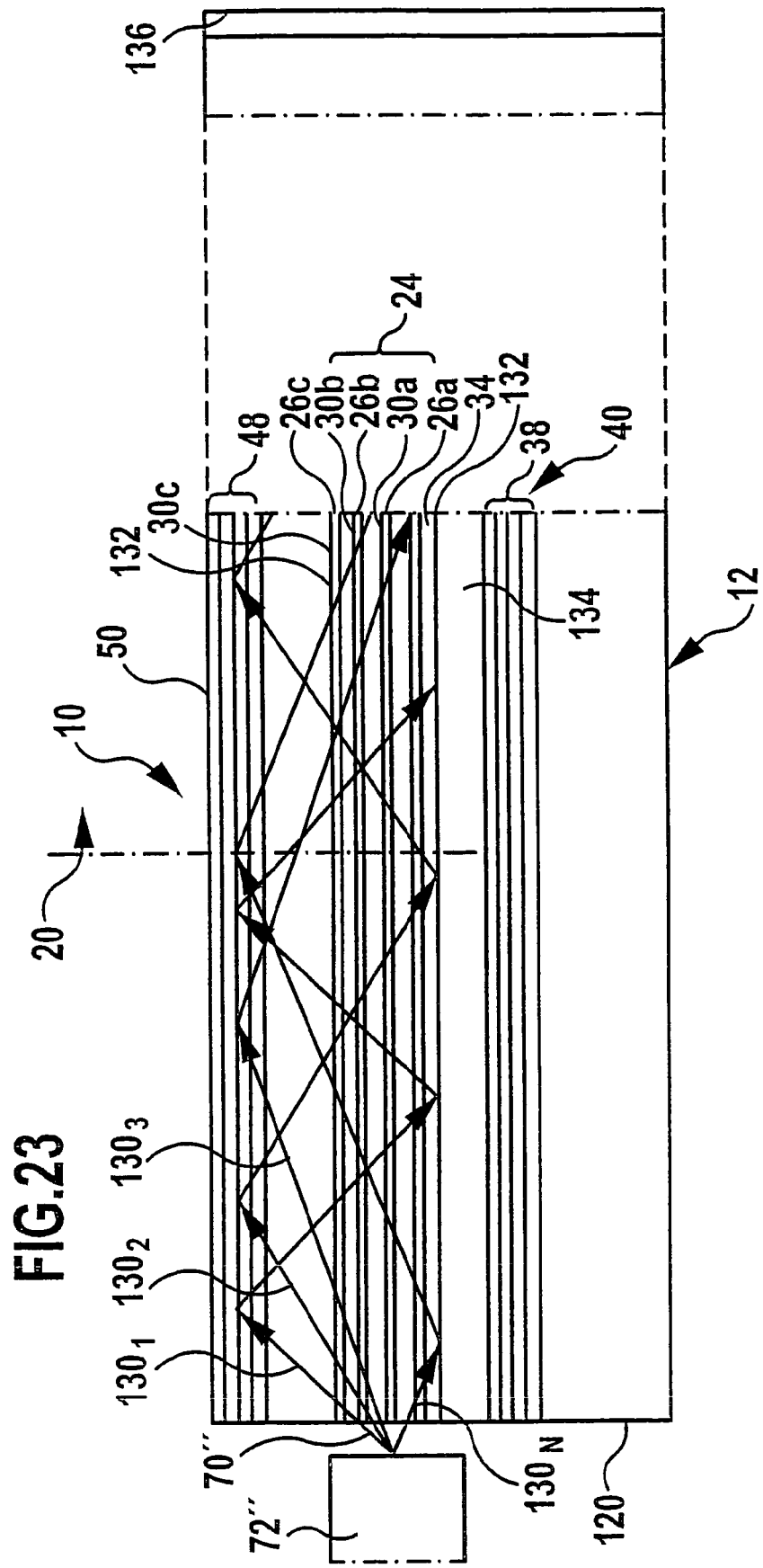
FIG. 23 shows a schematic illustration similar to FIG. 1 of a thirteenth embodiment.

In a thirteenth embodiment illustrated in FIG. 23, the pumping radiation source 72" is not arranged such that the pumping radiation field 70' enters the solid-state body 10 via the exit surface 50 for the laser amplifier radiation field 20 but is arranged such that the pumping radiation field 70" enters the solid-state body 10 via the side surface 120 thereof, namely preferably such that this takes place in the area of the laser-active volume area 24.

In this respect, it is assumed that the pumping radiation field 70" has a divergence such that the pumping radiation enters the solid-state body 10 with directions of propagation $130_1$ to $130_N$ which extend at different acute angles in relation to the planes 26, in which the quantum structures 30 extend.

The pumping radiation field 70" is guided in the solid-state body 10 in a direction parallel to the surfaces 26 in that the pumping radiation field 70" is reflected totally, on the one hand, close to the exit surface 50 by means of the antireflecting volume area 48 and is reflected, on the other hand, at a boundary surface 132 to an intermediate layer 134 which is arranged between the laser-active volume area 24 and the reflecting volume area 38 and has an index of refraction which is less than the index of refraction in the surrounding structure 34 of the laser-active volume area 24 adjacent to the boundary surface 132.

As a result of the reflections of the pumping radiation field 70" having the pumping radiation propagating in the different directions of propagation $130_1$ to $130_N$ at the antireflecting volume area 48 and the boundary surface 132 of the intermediate layer 134, a multiple pumping of the quantum structures 30 results at least at a sufficient distance from the side surface 120, for example, in a surface area 132 of the surfaces 26 on account of the fact that the pumping radiation field 70" propagates in a plurality of directions of propagation $130_1$ to $130_N$ at respectively different angles in relation to the surfaces 26 similar to a multimode wave guidance, in particular, when the pumping radiation field 70" is reflected back again in the direction of the pumping radiation source 72" in the area of a reflection surface 136 arranged on a side located opposite the pumping radiation source 72".

As for the rest, the quantum structures 30 in this embodiment can be designed in accordance with all the embodiments described in the above.

In the case of the thirteenth embodiment, as well, reference is made in full to the explanations concerning the preceding embodiments with respect to the features relating to the design of the quantum structures 30, the solid-state body 10 and the guidance of the laser amplifier radiation field 20.

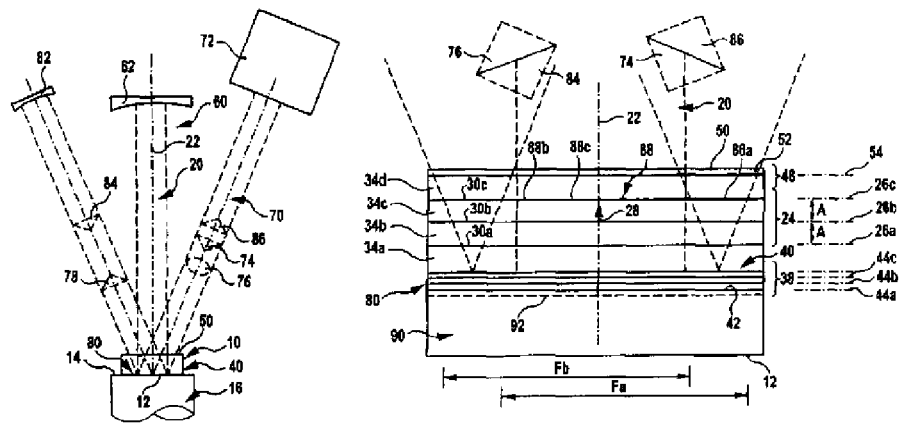

The invention claimed is:

1. Laser amplifier system comprising:
a solid-state body thermally coupled to a cooling member and having a laser-active volume area,
at least one laser-active quantum structure consisting of semiconductor material being arranged in said laser-active volume area in at least one surface and extending at least over partial areas of said surface, a pumping radiation source adapted to generate a pumping radiation field for the optical pumping of the laser-active volume area, and an optical means of the amplifier defining a laser amplifier radiation field passing through the laser-active volume area, wherein:

said laser-active quantum structure consists of one of:
a quantum well comprising a two-dimensional electron gas,
a quantum wire comprising a one-dimensional electron gas, and
a quantum point comprising a zero-dimensional electron gas, said pumping radiation source has a configuration and wavelength adapted to cause the direct absorption of pumping radiation from the pumping radiation field in the laser-active quantum structure to be equal to or greater than the absorption of pumping radiation by a surrounding structure adjacent to the laser-active quantum structure, and the pumping radiation field proceeds such that it passes through the laser-active quantum structure several times.

2. Laser amplifier system as defined in claim 1, wherein the absorption of pumping radiation in the at least one quantum structure outweighs the absorption of pumping radiation in the surrounding structure adjacent to the quantum structure.

3. Laser amplifier system as defined in claim 1, wherein the absorption of pumping radiation in the surrounding structure is negligible in comparison with the absorption of the pumping radiation in the quantum structure.

4. Laser amplifier system as defined in claim 1, wherein the absorption of pumping radiation in the at least one quantum structure outweighs the absorption of pumping radiation in the volume areas of the solid-state body outside the quantum structure.

5. Laser amplifier system as defined in claim 1, wherein the laser-active volume area has several quantum structures located at a distance from one another but in surfaces arranged one above the other in a stacking direction.

6. Laser amplifier system as defined in claim 1, wherein the surrounding structure is formed from a semiconductor material.

7. Laser amplifier system as defined in claim 6, wherein the surrounding structure is formed by layers consisting of semiconductor material.

8. Laser amplifier system as defined in claim 6, wherein the semiconductor material of the quantum structure has a smaller band distance than the surrounding structure.

9. Laser amplifier system as defined in claim 1, wherein at least one respective surrounding structure is arranged on either side of the surface, in which the quantum structure is arranged.

10. Laser amplifier system as defined in claim 1, wherein each surrounding structure has transversely to the surface a thickness amounting to a multiple of the thickness of the quantum structure.

11. Laser amplifier system as defined in claim 1, wherein the surrounding structure has transversely to the surface a thickness amounting to at least 10 nm.

12. Laser amplifier system as defined in claim 11, wherein the surrounding structure has transversely to the surface a thickness amounting to at least 30 nm.

13. Laser amplifier system as defined in claim 5, wherein the quantum structures are separated from one another by intermediate layers lying between them.

14. Laser amplifier system as defined in claim 13, wherein the absorption of pumping radiation from the pumping radiation field in the quantum structures is equal to or greater than the absorption of pumping radiation by the intermediate layers.

15. Laser amplifier system as defined in claim 1, wherein the laser amplifier radiation field proceeds transversely to the surface in which the quantum structure extends.

16. Laser amplifier system as defined in claim 14, wherein the laser amplifier radiation field proceeds through the quantum structures approximately in the direction of the stacking direction.

17. Laser amplifier system as defined in claim 16, wherein in the case of at least some of the quantum structures these have between them in the stacking direction distances corresponding approximately to half the wavelength or to an integral multiple of half the wavelength of the laser amplifier radiation field in the case of optimum laser amplification.

18. Laser amplifier system as defined in claim 1, wherein the surface, in which the quantum structure is arranged, extends approximately parallel to an outer cooling surface of the solid-state body.

19. Laser amplifier system as defined in claim 1, wherein the surface, in which the quantum structure is arranged, extends approximately parallel to an exit surface for the laser amplifier radiation field.

20. Laser amplifier system as defined in claim 19, wherein an optically inactive layer with a thickness amounting to a multiple of the wavelength of the laser amplifier radiation field is located between the exit surface for the laser amplifier radiation field and the surface, in which the quantum structure extends.

21. Laser amplifier system as defined in claim 1, wherein the quantum structure has a thickness so slight that an increase in the density of states at the band edge occurs.

22. Laser amplifier system as defined in claim 1, wherein the quantum structure has a thickness approximately in the order of magnitude of the wavelength of the electrons in the material of the quantum structure.

23. Laser amplifier system as defined in claim 1, wherein the quantum structure has a thickness of less than 20 nm transversely to the surface.

24. Laser amplifier system as defined in claim 1, wherein the quantum structure is designed as a quantum film.

25. Laser amplifier system as defined in claim 1, wherein the quantum structure is formed from quantum wires.

26. Laser amplifier system as defined in claim 1, wherein the quantum structure is formed from quantum points.

27. Laser amplifier system as defined in claim 1, wherein the solid-state body has a reflector for the laser amplifier radiation field on one side of the laser-active volume area.

28. Laser amplifier system as defined in claim 27, wherein the reflector is an internal reflector arranged in the solid-state body.

29. Laser amplifier system as defined in claim 28, wherein the internal reflector is formed by a series of layers.

30. Laser amplifier system as defined in claim 28, wherein the solid-state body is provided on one side of the laser-active volume area with a reflecting volume area forming the internal reflector.

31. Laser amplifier system as defined in claim 30, wherein the reflecting volume area has an area designed as a Bragg reflector.

32. Laser amplifier system as defined in claim 27, wherein the internal reflector is arranged at a distance from the cooling surface amounting to less than 100 μm.

33. Laser amplifier system as defined in claim 1, wherein the pumping radiation field passes through the laser active volume area several times in a direction extending transversely to the surface, in which the quantum structure extends.

34. Laser amplifier system as defined in claim 33, wherein the pumping radiation field passes through the same outer surface of the solid-state body as the laser amplifier radiation field.

35. Laser amplifier system as defined in claim 34, wherein the outer surface is arranged so as to be located opposite the cooling surface.

36. Laser amplifier system as defined in claim 1, wherein the surface, in which the quantum structure is arranged, extends approximately parallel to a surface of the solid-state body for passage of the pumping radiation field.

37. Laser amplifier system as defined in claim 1, wherein the solid-state body is provided with a reflector for the pumping radiation field on one side of the laser-active volume area.

38. Laser amplifier system as defined in claim 37, wherein the reflector is a reflector arranged in the solid-state body.

39. Laser amplifier system as defined in claim 38, wherein the internal reflector is formed by a series of layers.

40. Laser amplifier system as defined in claim 38, wherein the internal reflector for the pumping radiation field is formed by a reflecting volume area.

41. Laser amplifier system as defined in claim 40, wherein the reflecting volume area comprises an area designed as a Bragg reflector.

42. Laser amplifier system as defined in claim 27, wherein the reflector for the laser amplifier radiation field and the reflector for the pumping radiation field are combined to form one reflector.

43. Laser amplifier system as defined in claim 42, wherein the reflector is formed by a series of layers, the construction and arrangement of said layers being optimized with respect to the wavelength and the angle of incidence of the laser amplifier radiation field and to the wavelength and the angle of incidence of the pumping radiation field.

44. Laser amplifier system as defined in claim 1, wherein one quantum structure is provided in each surface.

45. Laser amplifier system as defined in claim 1, wherein the pumping radiation field passes through the surface, in which the respective quantum structure extends, in a surface area smaller than the extension of the quantum structure in the direction of the surface.

46. Laser amplifier structure as defined in claim 45, wherein the pumping radiation field passes through one surface area during each passage through the surface, in which the quantum structure is arranged, and wherein the sum of the surface areas results in an interconnected excitation area.

47. Laser amplifier system as defined in claim 1, wherein the solid-state body is designed to be antireflecting for the laser amplifier radiation field on one side of the laser-active volume area.

48. Laser amplifier system as defined in claim 47, wherein the solid-state body is provided with an antireflecting volume area on one side of the laser-active volume area.

49. Laser amplifier system as defined in claim 47, wherein the antireflecting volume area and the volume area forming the reflector are arranged on different sides of the laser-active volume area in a stacking direction.

50. Laser amplifier system as defined in claim 1, wherein the solid-state body is designed to be antireflecting on an entry side of the pumping radiation field.

51. Laser amplifier system as defined in claim 50, wherein the solid-state body is provided with an antireflecting volume area.

52. Laser amplifier system as defined in claim 50, wherein the solid-state body is designed to be antireflecting for the pumping radiation field on one side of the laser-active volume area.

53. Laser amplifier system as defined in claim 52, wherein the antireflecting volume area and the volume area forming the reflector are arranged on different sides of the laser-active volume area in a stacking direction.

54. Laser amplifier system as defined in claim 1, wherein the laser amplifier radiation field is defined by an optical means of the amplifier comprising at least one external mirror arranged at a distance from the solid-state body.

55. Laser amplifier system as defined in claim 1, wherein the optical means of the amplifier is designed such that it admits only a laser radiation field with the basic mode or with the basic mode and modes close to the basic mode.

* * * * *

UNITED STATES PATENT AND TRADEMARK OFFICE
CERTIFICATE OF CORRECTION

| | | |
|---|---|---|
| PATENT NO. | : 7,756,172 B2 | |
| APPLICATION NO. | : 10/999894 | |
| DATED | : July 13, 2010 | |
| INVENTOR(S) | : Adolf Giesen | |

It is certified that error appears in the above-identified patent and that said Letters Patent is hereby corrected as shown below:

Col. 20 lines 16-21 should read

18. Laser amplifier system as defined in claim 17, wherein the distances between the quantum structures correspond approximately to half the wavelength or to the integral multiple of half the wavelength of the optimum laser amplification in a thermodynamic state of equilibrium during laser amplification of the laser-active volume area.

Col. 22 lines 6-10 should read

46. Laser amplifier system as defined in claim 1, wherein the quantum structure has transversely to the stacking direction an extension smaller than that of the solid-state body in this direction.

Col. 22 lines 18-21 should read

49. Laser amplifier system as defined in claim 1, wherein several quantum structures arranged next to one another are provided in each surface.

Col. 22 lines 25-27 should read

51. Laser amplifier system as defined in claim 1, wherein the pumping radiation field passes at the same time through non-connected partial surface areas of the surface, in which the at least one quantum structure is arranged, and optically pumps the at least one quantum structure present within these partial surface areas.

Signed and Sealed this
Twenty-ninth Day of March, 2011

David J. Kappos
*Director of the United States Patent and Trademark Office*

Col. 22 lines 28-31 should read

52. Laser amplifier system as defined in claim 51, wherein the pumping radiation field has non-connected pumping radiation field segments, each of said segments passing through at least one of the partial surface areas.

Col. 22 lines 32-35 should read

53. Laser amplifier system as defined in claim 48, wherein quantum structures arranged so as to follow one another in a direction transverse to the stacking direction are separated optically from one another.

Col. 22 lines 36-39 should read

54. Laser amplifier system as defined in claim 53, wherein the quantum structures are separated from one another by barriers consisting of optically absorbing materials.

Col. 22 lines 40-43 should read

55. Laser amplifier system as defined in claim 54, wherein the quantum structures are enclosed by barriers consisting of optically absorbing materials.

Col. 22 line 44 - insert

--56. Laser amplifier system as defined in claim 55, wherein the barriers consisting of optically absorbing materials form a closed contour in the surfaces, in which the quantum structures are located.

64. Laser amplifier system as defined in claim 1, wherein the pumping radiation field enters the solid-state body via a side surface.

65. Laser amplifier system as defined in claim 64, wherein the pumping radiation field enters the solid-state body divergently and is guided in said solid-state body by way of reflections in a direction transverse to the optical axis of the laser amplifier radiation field.

66. Laser amplifier system as defined in claim 65, wherein the reflections of the pumping radiation field are brought about by way of refractive index gradients and/or refractive index steps in the solid-state body.--

UNITED STATES PATENT AND TRADEMARK OFFICE
CERTIFICATE OF CORRECTION

| | | |
|---|---|---|
| PATENT NO. | : 7,756,172 B2 | Page 1 of 6 |
| APPLICATION NO. | : 10/999894 | |
| DATED | : July 13, 2010 | |
| INVENTOR(S) | : Adolf Giesen | |

It is certified that error appears in the above-identified patent and that said Letters Patent is hereby corrected as shown below:

Delete the title page and substitute therefore the attached title page showing the corrected number of claims in patent.

Col. 20, line 16 - col. 22, line 43 should read:

17. Laser amplifier system as defined in claim 16, wherein in the case of at least some of the quantum structures these have between them in the stacking direction distances corresponding approximately to half the wavelength or to an integral multiple of half the wavelength of the laser amplifier radiation field in the case of optimum laser amplification.

18. Laser amplifier system as defined in claim 17, wherein the distances between the quantum structures correspond approximately to half the wavelength or to the integral multiple of half the wavelength of the optimum laser amplification in a thermodynamic state of equilibrium during laser amplification of the laser-active volume area.

19. Laser amplifier system as defined in claim 1, wherein the surface, in which the quantum structure is arranged, extends approximately parallel to an outer cooling surface of the solid-state body.

20. Laser amplifier system as defined in claim 1, wherein the surface, in which the quantum structure is arranged, extends approximately parallel to an exit surface for the laser amplifier radiation field.

21. Laser amplifier system as defined in claim 20, wherein an optically inactive layer with a thickness amounting to a multiple of the wavelength of the laser amplifier radiation field is located between the exit surface for the laser amplifier radiation field and the surface, in which the quantum structure extends.

This certificate supersedes the Certificate of Correction issued March 29, 2011.

Signed and Sealed this
Eleventh Day of September, 2012

David J. Kappos
*Director of the United States Patent and Trademark Office*

22. Laser amplifier system as defined in claim 1, wherein the quantum structure has a thickness so slight that an increase in the density of states at the band edge occurs.

23. Laser amplifier system as defined in claim 1, wherein the quantum structure has a thickness approximately in the order of magnitude of the wavelength of the electrons in the material of the quantum structure.

24. Laser amplifier system as defined in claim 1, wherein the quantum structure has a thickness of less than 20 nm transversely to the surface.

25. Laser amplifier system as defined in claim 1, wherein the quantum structure is designed as a quantum film.

26. Laser amplifier system as defined in claim 1, wherein the quantum structure is formed from quantum wires.

27. Laser amplifier system as defined in claim 1, wherein the quantum structure is formed from quantum points.

28. Laser amplifier system as defined in claim 1, wherein the solid-state body has a reflector for the laser amplifier radiation field on one side of the laser-active volume area.

29. Laser amplifier system as defined in claim 28, wherein the reflector is an internal reflector arranged in the solid-state body.

30. Laser amplifier system as defined in claim 29, wherein the internal reflector is formed by a series of layers.

31. Laser amplifier system as defined in claim 29, wherein the solid-state body is provided on one side of the laser-active volume area with a reflecting volume area forming the internal reflector.

32. Laser amplifier system as defined in claim 31, wherein the reflecting volume area has an area designed as a Bragg reflector.

33. Laser amplifier system as defined in claim 28, wherein the internal reflector is arranged at a distance from the cooling surface amounting to less than 100 μm.

34. Laser amplifier system as defined in claim 1, wherein the pumping radiation field passes through the laser active volume area several times in a direction extending transversely to the surface, in which the quantum structure extends.

35. Laser amplifier system as defined in claim 34, wherein the pumping radiation field passes through the same outer surface of the solid-state body as the laser amplifier radiation field.

36. Laser amplifier system as defined in claim 35, wherein the outer surface is arranged so as to be located opposite the cooling surface.

37. Laser amplifier system as defined in claim 1, wherein the surface, in which the quantum structure is arranged, extends approximately parallel to a surface of the solid-state body for passage of the pumping radiation field.

38. Laser amplifier system as defined in claim 1, wherein the solid-state body is provided with a reflector for the pumping radiation field on one side of the laser-active volume area.

39. Laser amplifier system as defined in claim 38, wherein the reflector is a reflector arranged in the solid-state body.

40. Laser amplifier system as defined in claim 39, wherein the internal reflector is formed by a series of layers.

41. Laser amplifier system as defined in claim 39, wherein the internal reflector for the pumping radiation field is formed by a reflecting volume area.

42. Laser amplifier system as defined in claim 41, wherein the reflecting volume area comprises an area designed as a Bragg reflector.

43. Laser amplifier system as defined in claim 28, wherein the reflector for the laser amplifier radiation field and the reflector for the pumping radiation field are combined to form one reflector.

44. Laser amplifier system as defined in claim 43, wherein the reflector is formed by a series of layers, the construction and arrangement of said layers being optimized with respect to the wavelength and the angle of incidence of the laser amplifier radiation field and to the wavelength and the angle of incidence of the pumping radiation field.

45. Laser amplifier system as defined in claim 1, wherein one quantum structure is provided in each surface.

46. Laser amplifier system as defined in claim 1, wherein the pumping radiation field passes through the surface, in which the respective quantum structure extends, in a surface area smaller than the extension of the quantum structure in the direction of the surface.

47. Laser amplifier structure as defined in claim 46, wherein the pumping radiation field passes through one surface area during each passage through the surface, in which the quantum structure is arranged, and wherein the sum of the surface areas results in an interconnected excitation area.

48. Laser amplifier system as defined in claim 1, wherein the solid-state body is designed to be antireflecting for the laser amplifier radiation field on one side of the laser-active volume area.

49. Laser amplifier system as defined in claim 48, wherein the solid-state body is provided with an antireflecting volume area on one side of the laser-active volume area.

50. Laser amplifier system as defined in claim 48, wherein the antireflecting volume area and the volume area forming the reflector are arranged on different sides of the laser-active volume area in a stacking direction.

51. Laser amplifier system as defined in claim 1, wherein the solid-state body is designed to be antireflecting on an entry side of the pumping radiation field.

52. Laser amplifier system as defined in claim 51, wherein the solid-state body is provided with an antireflecting volume area.

53. Laser amplifier system as defined in claim 51, wherein the solid-state body is designed to be antireflecting for the pumping radiation field on one side of the laser-active volume area.

54. Laser amplifier system as defined in claim 53, wherein the antireflecting volume area and the volume area forming the reflector are arranged on different sides of the laser-active volume area in a stacking direction.

55. Laser amplifier system as defined in claim 1, wherein the laser amplifier radiation field is defined by an optical means of the amplifier comprising at least one external mirror arranged at a distance from the solid-state body.

Col. 22, line 44, insert following claims:

56. Laser amplifier system as defined in claim 1, wherein the optical means of the amplifier is designed such that it admits only a laser radiation field with the basic mode or with the basic mode and modes close to the basic mode.

57. Laser amplifier system as defined in claim 1, wherein the quantum structure has transversely to the stacking direction an extension smaller than that of the solid-state body in this direction.

58. Laser amplifier system as defined in claim 1, wherein several quantum structures arranged next to one another are provided in each surface.

59. Laser amplifier system as defined in claim 1, wherein the pumping radiation field passes at the same time through non-connected partial surface areas of the surface, in which the at least one quantum structure is arranged, and optically pumps the at least one quantum structure present within these partial surface areas.

60. Laser amplifier system as defined in claim 59, wherein the pumping radiation field has non-connected pumping radiation field segments, each of said segments passing through at least one of the partial surface areas.

61. Laser amplifier system as defined in claim 58, wherein quantum structures arranged so as to follow one another in a direction transverse to the stacking direction are separated optically from one another.

62. Laser amplifier system as defined in claim 61, wherein the quantum structures are separated from one another by barriers consisting of optically absorbing materials.

63. Laser amplifier system as defined in claim 62, wherein the quantum structures are enclosed by barriers consisting of optically absorbing materials.

64. Laser amplifier system as defined in claim 63, wherein the barriers consisting of optically absorbing materials form a closed contour in the surfaces, in which the quantum structures are located.

65. Laser amplifier system as defined in claim 1, wherein the pumping radiation field enters the solid-state body via a side surface.

66. Laser amplifier system as defined in claim 65, wherein the pumping radiation field enters the solid-state body divergently and is guided in said solid-state body by way of reflections in a direction transverse to the optical axis of the laser amplifier radiation field.

67. Laser amplifier system as defined in claim 66, wherein the reflections of the pumping radiation field are brought about by way of refractive index gradients and/or refractive index steps in the solid-state body.

(12) United States Patent
Giesen et al.

(10) Patent No.: US 7,756,172 B2
(45) Date of Patent: Jul. 13, 2010

(54) OPTICALLY PUMPED SEMI-CONDUCTIVE LASER

(75) Inventors: Adolf Giesen, Aichtal (DE);
Svent-Simon Beyertt, Esslingen (DE);
Uwe Brauch, Stuttgart (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 394 days.

(21) Appl. No.: 10/999,894

(22) Filed: Nov. 29, 2004

(65) Prior Publication Data
US 2005/0152415 A1    Jul. 14, 2005

Related U.S. Application Data

(63) Continuation of application No. PCT/EP03/05270, filed on May 20, 2003.

(30) Foreign Application Priority Data
May 29, 2002    (DE) ............................. 102 23 879

(51) Int. Cl.
*H01S 3/04* (2006.01)
(52) U.S. Cl. .................. 372/34; 372/35; 372/43.01; 372/50.1; 372/50.22
(58) Field of Classification Search .......... 372/34, 372/35, 50.1, 50.22, 43.01, 70, 71
See application file for complete search history.

(56) References Cited

U.S. PATENT DOCUMENTS

| 5,131,002 A | 7/1992 | Mooradian |
| 5,313,324 A | 5/1994 | Le et al. |

(Continued)

FOREIGN PATENT DOCUMENTS

| DE | 19835107 | 2/2000 |

(Continued)

OTHER PUBLICATIONS

Jeong, et al., "Analysis and assessment of the gain of optically pumped surface-normal optical amplifiers," *Optics Communications*, Feb. 15, 1997, pp. 227-232.

(Continued)

*Primary Examiner*—Minsun Harvey
*Assistant Examiner*—Delma R Forde
(74) *Attorney, Agent, or Firm*—Cohen Pontani Lieberman & Pavane LLP

(57) ABSTRACT

In order to operate a laser amplifier system comprising a solid-state body thermally coupled to a cooling member and having a laser active volume area, in which at least one laser-active amplifier structure consisting of semiconductor material is arranged in at least one surface and extends at least over partial areas of the surface, a pumping radiation source generating a pumping radiation field for the optical pumping of the laser-active volume area and an optical means of the amplifier defining a laser amplifier radiation field passing through the laser active volume area, as efficiently as possible it is suggested that the absorption of pumping radiation from the pumping radiation field in the laser-active amplifier structure be equal to or greater than the absorption of pumping radiation by a surrounding structure adjacent to the amplifier structure and that the pumping radiation field proceed such that it passes several times through the amplifier structure.

67 Claims, 12 Drawing Sheets